(12) United States Patent
Torigoe et al.

(10) Patent No.: US 9,818,609 B2
(45) Date of Patent: Nov. 14, 2017

(54) EPITAXIAL-SILICON-WAFER MANUFACTURING METHOD AND EPITAXIAL SILICON WAFER

(71) Applicant: SUMCO CORPORATION, Tokyo (JP)

(72) Inventors: Kazuhisa Torigoe, Tokyo (JP); Toshiaki Ono, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/120,630

(22) PCT Filed: Dec. 19, 2014

(86) PCT No.: PCT/JP2014/083682
§ 371 (c)(1),
(2) Date: Aug. 22, 2016

(87) PCT Pub. No.: WO2015/129133
PCT Pub. Date: Sep. 3, 2015

(65) Prior Publication Data
US 2017/0011918 A1     Jan. 12, 2017

(30) Foreign Application Priority Data
Feb. 26, 2014  (JP) .................................. 2014-035969

(51) Int. Cl.
*H01L 21/02* (2006.01)
*C23C 16/24* (2006.01)
(Continued)

(52) U.S. Cl.
CPC ........ *H01L 21/02694* (2013.01); *C23C 16/24* (2013.01); *C30B 25/186* (2013.01);
(Continued)

(58) Field of Classification Search
CPC ................................................ H01L 21/02694
See application file for complete search history.

(56) References Cited

U.S. PATENT DOCUMENTS 5,951,755 A     9/1999  Miyashita et al.
2002/0157597 A1  10/2002  Takeno
(Continued)

FOREIGN PATENT DOCUMENTS

JP      09-283529 A    10/1997
JP      2006-40972 A   2/2006
(Continued)

OTHER PUBLICATIONS

Sueoka et al., "Effect of Heavy Boron Doping on Oxygen Precipitation in Czochralski Silicon Substrates of Epitaxial Wafers," Journal of The Electrochemical Society, 147 (2), pp. 756-762, 2000.
(Continued)

*Primary Examiner* — Daniel Shook
(74) *Attorney, Agent, or Firm* — Greenblum & Bernstein, P.L.C.

(57) ABSTRACT

A manufacturing method of an epitaxial silicon wafer including a silicon wafer doped with boron and having a resistivity of 100 mΩ·cm or less and an epitaxial film formed on the silicon wafer includes: growing the epitaxial film on the silicon wafer; and applying a heat treatment on the epitaxial silicon wafer at a temperature of less than 900 degrees C.

2 Claims, 19 Drawing Sheets

(51) Int. Cl.
  *C30B 25/20* (2006.01)
  *H01L 21/324* (2006.01)
  *C30B 25/18* (2006.01)
  *C30B 29/06* (2006.01)
  *C30B 33/02* (2006.01)
  *H01L 29/10* (2006.01)
  *H01L 29/32* (2006.01)

(52) U.S. Cl.
  CPC .............. *C30B 25/20* (2013.01); *C30B 29/06* (2013.01); *C30B 33/02* (2013.01); *H01L 21/0262* (2013.01); *H01L 21/02381* (2013.01); *H01L 21/02532* (2013.01); *H01L 21/324* (2013.01); *H01L 29/1083* (2013.01); *H01L 29/32* (2013.01)

(56) References Cited

U.S. PATENT DOCUMENTS

2008/0038526 A1* 2/2008 Kume ................... C30B 25/20
                                                                  428/218
2010/0151692 A1* 6/2010 Ono ................. H01L 21/02381
                                                                  438/758

FOREIGN PATENT DOCUMENTS

| JP | 2010-141272 A | 6/2010 |
| TW | 201115647 A1 | 5/2011 |
| TW | 201404953 A | 2/2014 |
| WO | 01/56071 A1 | 8/2001 |
| WO | 2013/153724 A1 | 10/2013 |

OTHER PUBLICATIONS

Sugimura et al., "Behavior of nucleation defects in high doped CZ-Si Crystals," The Japan Society of Applied Physics, separate vol. 1, pp. 319, 2005.

International Search Report issued in Patent Application No. PCT/JP2014/083682, dated Mar. 3, 2015, along with an English translation thereof.

International Preliminary Report on Patentability issued in Patent Application No. PCT/JP2014/083682, dated Aug. 30, 2016.

Office Action issued in Taiwan Counterpart Patent Appl. No. 103145416, dated Dec. 4, 2015, along with an English translation thereof.

* cited by examiner

EPITAXIAL-SILICON-WAFER MANUFACTURING METHOD AND EPITAXIAL SILICON WAFER

TECHNICAL FIELD

The present invention relates to a manufacturing method of an epitaxial silicon wafer and an epitaxial silicon wafer.

BACKGROUND ART

An epitaxial wafer including a silicon water obtained by cutting a silicon monocrystal and an epitaxial film grown through vapor-phase growth on the surface of the silicon wafer has been known. The epitaxial film is formed through CVD (a kind of vapor-phase growth). There is theoretically no oxygen in the epitaxial film and an oxygen concentration in the epitaxial film is actually zero or almost zero. When the oxygen concentration in the epitaxial film is low as described above, for instance, during a heat treatment (e.g. a device process), a dislocation sometimes occurs in the epitaxial film and the dislocation sometimes extends. Thus, studies have been made in order to avoid the occurrence of such dislocation extension (see, for instance, Patent Literature 1).

In Patent Literature 1, it is disclosed that the oxygen concentration on the surface of the epitaxial film relates to the occurrence of the dislocation and the extension of the dislocation can be prevented by setting the oxygen concentration on the surface of the epitaxial film within a range from $1.0 \times 10^{17}$ to $12 \times 10^{17}$ atoms/cm$^3$ (according to ASTM F-121, 1979). Patent Literature 1 also discloses that, in order to manufacture an epitaxial silicon wafer having such a property, an oxygen-concentration-setting heat-treatment step, in which the silicon wafer is subjected to a heat treatment at a heat treatment temperature in a range from 900 degrees C. to the melting point of silicon, is performed after forming the epitaxial film. The high-temperature heat treatment applied after forming the epitaxial film thermally diffuses the oxygen solid-solved in the silicon wafer to the epitaxial film to increase the oxygen concentration in the epitaxial film.

CITATION LIST

Patent Literature(s)

Patent Literature 1 JP-A-2010-141272

SUMMARY OF THE INVENTION

Problem(s) to be Solved by the Invention

When an integrated circuit on a semiconductor device is actuated, a phenomenon (so-called "latch-up"), where floating charges generated upon actuation of the integrated circuit drives unintended parasitic transistor, sometimes occurs. When the latch-up phenomenon occurs, the semiconductor device does not normally function and it is sometimes necessary to power off the semiconductor device in order to restore a normal operation of the semiconductor device.

In order to prevent the occurrence of latch-up, a p/p$^+$ epitaxial wafer has been used. The p/p$^+$ epitaxial wafer is a low-resistivity silicon wafer (p$^+$ silicon wafer) doped with a high concentration of boron, on a surface of which an epitaxial film is grown. The p/p$^+$ epitaxial wafer has been widely used because of the advantages in the improvement in the function of the device (e.g. prevention of expansion of a depletion layer in accordance with voltage applied around a trench of a trench capacitor) as well as the above-described prevention of the latch-up phenomenon.

However, when the high temperature heat treatment as disclosed in Patent Literature 1 is applied to the p/p$^+$ epitaxial wafer, not only the oxygen solid-solved in the silicon wafer but also the boron in the silicon wafer also is likely to thermally diffuse into the epitaxial film, so that the resistivity of the epitaxial film may be changed to fall outside the desired resistivity range.

An object of the invention is to provide a manufacturing method of an epitaxial silicon wafer capable of restraining a dislocation extension without changing the resistivity of the epitaxial film even when a low-resistivity silicon wafer is used, and an epitaxial silicon wafer.

Means for Solving the Problem(s)

After vigorous studies, the inventors have found that an average oxygen concentration in an epitaxial film can be increased using enhanced diffusion effect of oxygen by boron by controlling heat-treatment conditions performed after an epitaxial-film-formation step in an epitaxial silicon wafer using a low-resistivity silicon wafer while restraining diffusion of boron to the epitaxial film, so that the resistivity of the epitaxial film is not affected.

The invention has been reached based on the above findings.

A manufacturing method according to an aspect of the invention is for manufacturing an epitaxial silicon wafer including: a silicon wafer doped with boron and having a resistivity of 100 mΩ·cm or less; and an epitaxial film provided on a surface of the silicon water, the method including: growing the epitaxial film on the silicon wafer; and applying a heat treatment on the epitaxial silicon wafer at a temperature of less than 900 degrees C.

According to the manufacturing method of an epitaxial silicon wafer of the above aspect of the invention, since the low-resistivity silicon wafer whose resistivity is 100 mΩ·cm or less is used and the heat treatment is applied under a temperature of less than 900 degrees C., an enhanced diffusion effect of oxygen in the epitaxial film by boron can be caused. Thus, the average oxygen concentration in the epitaxial film can be sufficiently enhanced and thus an epitaxial silicon wafer capable of restraining the dislocation extension can be manufactured. Further, since the heat treatment is applied at a temperature of less than 900 degrees C., the thermal diffusion of boron from the silicon wafer into the epitaxial film can be restrained.

In the manufacturing method of the above aspect of the invention, it is preferable that an oxygen concentration of the silicon wafer before being subjected to the heat treatment is $8 \times 10^{17}$ atoms/cm$^3$ or more and $18 \times 10^{17}$ atoms/cm$^3$ or less (according to ASTM F-121, 1979), and a film thickness of the epitaxial film is 0.5 μm or more and 8.0 μm or less.

It is found that, even when oxygen is diffused from the silicon wafer to the epitaxial film, a substrate oxygen concentration (an oxygen concentration in the silicon wafer) before and after the diffusion hardly changes.

With the use of the silicon wafer whose substrate oxygen concentration is set within the above range and through a simple process of controlling the heat treatment temperature applied after forming the epitaxial film, an amount of oxygen sufficient to prevent dislocation extension can be diffused into the epitaxial Further, with the film thickness of the epitaxial film within the above range, the average oxygen concentration of the epitaxial film can be sufficiently increased to prevent the dislocation extension.

In the manufacturing method of an epitaxial silicon wafer according to the above aspect of the invention, it is preferable that an average oxygen concentration of the epitaxial film after the heat treatment is $1.7 \times 10^{17}$ atoms/cm$^3$ (according to ASTM F-121, 1979) or more.

When the average oxygen concentration of the epitaxial film is within the above range, the dislocation extension can be prevented.

In the manufacturing method of an epitaxial silicon wafer according to the above aspect of the invention, it is preferable that the heat treatment is performed to satisfy a formula (1):

$$t \geq 3.71 \times 10^{56} \times X^{-7.03} \times Y^{0.27} \times Z^{3.34} \times T^{-16.7} \qquad (1),$$

where: X ($\times 10^{17}$ atoms/cm$^3$) represents an oxygen concentration of the silicon wafer before growing the epitaxial film; Y ($\Omega \cdot$cm) represents a resistivity of the silicon wafer before growing the epitaxial film; Z (μm) represents a film thickness of the epitaxial film; T (degrees C.) represents a temperature of the heat treatment; and t (min) represents a time for the heat-treatment.

With a simple process of substituting the oxygen concentration of the silicon wafer, the resistivity of the silicon wafer, the film thickness of the epitaxial film and the heat treatment temperature in the above formula (1) to calculate the heat treatment time, an epitaxial silicon wafer capable of restraining the dislocation extension can be manufactured.

An epitaxial silicon wafer according to another aspect of the invention includes: a silicon wafer doped with boron and having a resistivity of 100 mΩ·cm or less; and an epitaxial film provided on a surface of the silicon wafer, in which an average oxygen concentration of the epitaxial film is $1.7 \times 10^{17}$ atoms/cm$^3$ (according to ASTM F-121, 1979) or more.

According to the epitaxial silicon wafer of the above aspect of the invention, since the average oxygen concentration of the epitaxial film is at least $1.7 \times 10^{17}$ atoms/cm$^3$, the dislocation extension in the heat treatment in a device process can be sufficiently restrained.

In the epitaxial silicon wafer according to the above aspect of the invention, it is preferable that, when an oxygen-concentration profile in a depth direction is measured, a. local oxygen-concentration increase profile is observable in a vicinity of an interface between the silicon wafer and the epitaxial film.

When a local oxygen-concentration increase profile is observed near an interface between the silicon wafer and the epitaxial film (sometimes simply referred to as an "interface" hereinafter) in measuring the oxygen-concentration profile in the depth direction, it is understandable that an enhanced diffusion effect of oxygen to the epitaxial film by boron occurs and the average oxygen concentration in the epitaxial film is reliably at a level capable of restraining the dislocation extension.

The term "local oxygen-concentration increase profile" herein refers to a depth profile of a depth differential (atoms/cm$^4$) of the oxygen concentration has a peak of $2 \times 10^{21}$ (atoms/cm$^4$) in the vicinity of the interface. The depth profile of the depth differential (atoms/cm$^4$) of the oxygen concentration herein can be obtained by a measurement (SIMS measurement) of an oxygen-concentration profile in the depth direction of the epitaxial silicon wafer. Further, the term "the vicinity of the interface" means a range in the depth direction from a position 1 μm away from the interface toward the epitaxial film to a position 0.5 μm away from the interface toward the substrate.

BRIEF DESCRIPTION OF DRAWING(S)

17 is a graph showing a result of a stress test in an example (Experiment 7), in which a silicon wafer having resistivity of 100 mΩυcm was used.

Figure 18:
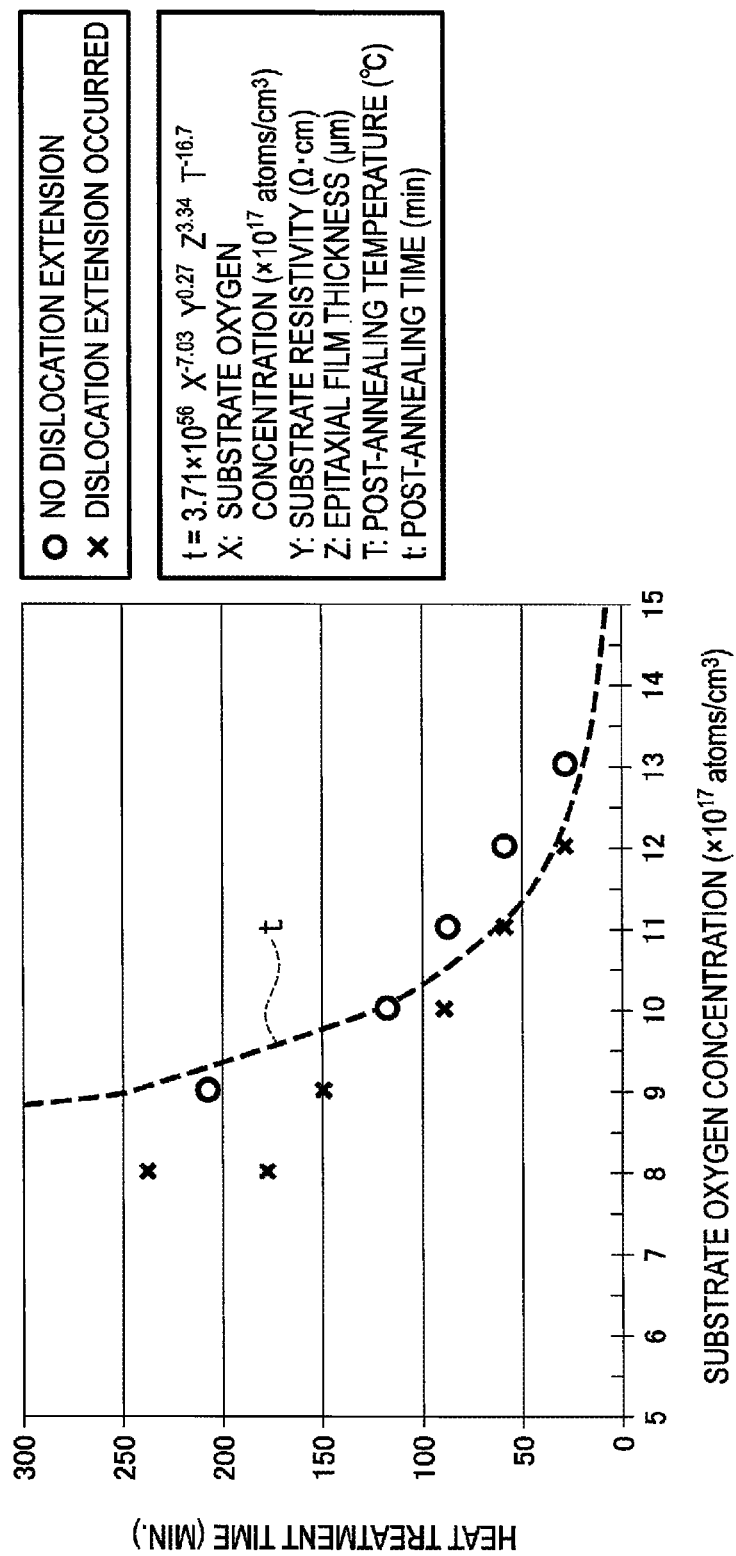

FIG. 18 is a graph showing a result of a stress test in Experiment 8.

Figure 19:
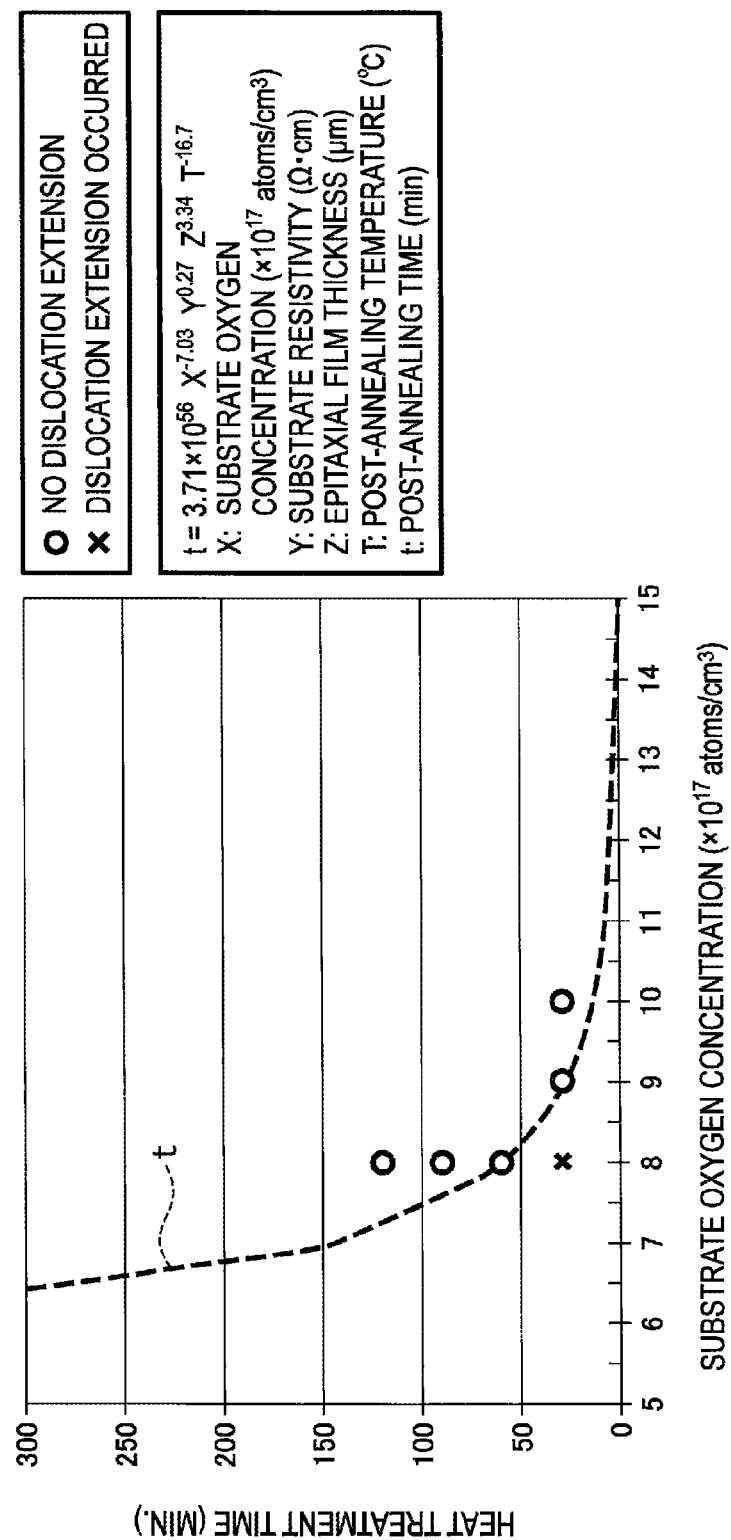

FIG. 19 is a graph showing a result of a stress test in Experiment 9.

DESCRIPTION OF EMBODIMENT(S)

Exemplary embodiment(s) of the invention will be described below with reference to the attached drawings.

Figure 1:
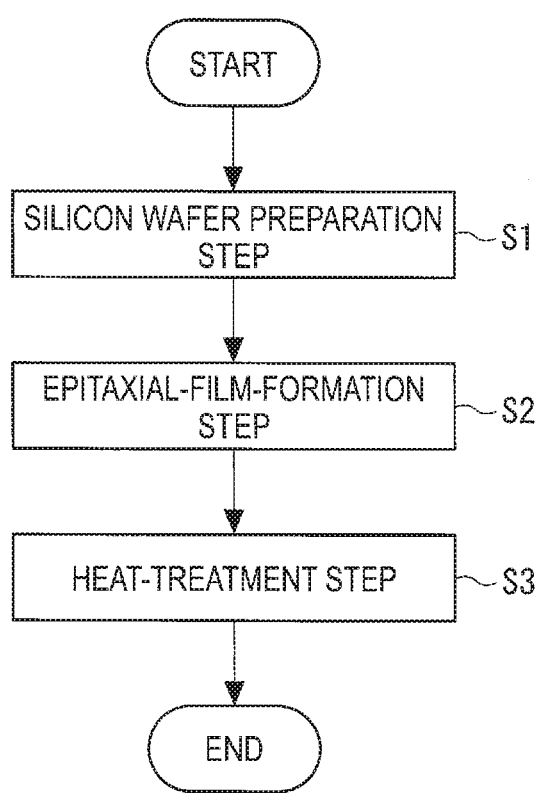
FIG. 1 is a flow chart showing a manufacturing method of an epitaxial silicon wafer according to an exemplary embodiment of the invention.
Figure 2:
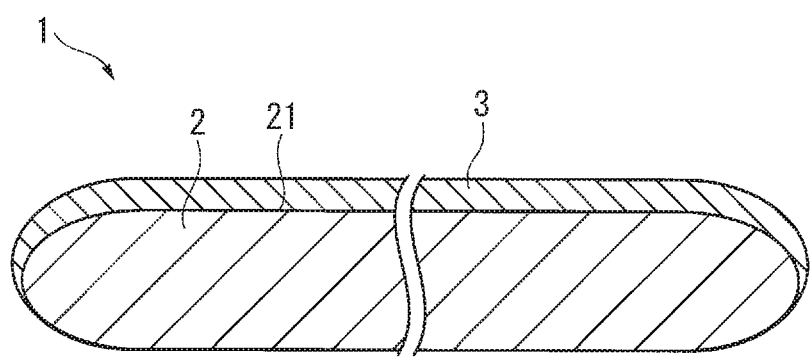
FIG. 2 is a cross section showing the epitaxial silicon water according to the above exemplary embodiment.

FIG. 1 is a flow chart showing a manufacturing method of an epitaxial silicon wafer. FIG. 2 is a cross section showing the epitaxial silicon wafer.

As shown in FIG. 1, in order to manufacture an epitaxial silicon wafer 1 shown in FIG. 2, a silicon wafer preparation step is initially performed (Step S1).

The silicon wafer preparation step includes all the steps required for preparing a silicon wafer 2 with a mirror-polished surface 2 from a monocrystal ingot pulled up by CZ process, MCZ (Magnetic field applied Czochralski) process and the like, the steps including slicing, chamfering, grinding, lapping, etching, polishing and washing. At this time, the oxygen concentration of the silicon wafer 2 is preferably $8 \times 10^{17}$ atoms/cm$^3$ or more and $18 \times 10^{17}$ atoms/cm$^3$ or less (according to ASTM F-121, 1979). When the oxygen concentration in the silicon wafer is within the above range, the oxygen concentration in the epitaxial film can be increased to the desired range in the below-described heat-treatment step.

Boron is added to the silicon wafer 2 so that the resistivity of the silicon wafer 2 is adjusted to be 100 mΩ·cm or less, preferably in a range from 5 mΩ·cm to 100 mΩ·cm.

Next, an epitaxial film formation step for forming an epitaxial film 3 on the silicon wafer 2 is performed (Step S2).

The silicon wafer 2 is placed in a reaction container of an epitaxial apparatus (not shown) and the temperature inside the reaction container is raised from an ambient temperature to a target temperature. The target temperature is preferably set in a range from 1050 degrees C. to 1280 degrees C. When the temperature inside the reaction container reaches the above target temperature, the epitaxial film 3 is grown on the surface 21 of the silicon wafer 2. For instance, a growth gas such as trichlorosilane is introduced into the reaction container and the epitaxial film 3 is formed in the atmosphere of the growth gas. It should be noted that a necessary dopant such as boron and phosphorus may be added during the film formation.

It is preferable that the epitaxial film formation step is performed until a film thickness T of the epitaxial film 3 becomes 0.5 μm or more and 8.0 μm or less. When the film thickness T of the epitaxial film 3 reaches the above range, the temperature of the epitaxial silicon wafer 1 is lowered from the temperature at which the epitaxial film 3 is grown to the ambient temperature.

Subsequently, a heat-treatment step for thermally treating the epitaxial silicon wafer 1 is performed (Step S3). In the heat-treatment step, the heat treatment conditions are controlled so that the temperature becomes less than 900 degrees C.

Further, it is preferable that the heat treatment time is controlled in a state that the temperature is within the above range.

Specifically, the heat treatment time is controlled so that a formula (1) below is satisfied, where X ($\times 10^{17}$ atom/cm$^3$) represents the oxygen concentration of the silicon wafer 2 before the epitaxial film formation step, Y (Ω·cm) represents the resistivity of the silicon wafer 2 before the epitaxial film formation step, Z (μm) represents the film thickness of the epitaxial film 3, T (degrees C.) represents the heat treatment temperature, and t (min) represents the heat treatment time.

$$t \geq 3.71 \times 10^{56} \times X^{-7.03} \times Y^{0.27} \times Z^{3.34} \times T^{-16.7} \quad (1)$$

When the heat treatment time is equal to or more than t obtained in the formula (1), the epitaxial silicon wafer 1, in which an average oxygen concentration in the epitaxial film 3 is adjusted to be $1.7 \times 10^{17}$ atoms/cm$^3$ (according to ASTM F-121, 1979) or more and the dislocation extension is eliminated, can be manufactured.

Advantage(s) of Exemplary Embodiment(s)

The above-described exemplary embodiment offers the following of effects and advantages.

(1) Since the low-resistivity silicon wafer whose resistivity is 100 mΩ·cm or less is used and the heat-treatment step is performed under a temperature of less than 900 degrees C., the enhanced diffusion effect of oxygen to the epitaxial film by boron can be caused. Thus, the average oxygen concentration in the epitaxial film can be sufficiently increased and thus an epitaxial silicon water capable of restraining the dislocation extension can be manufactured.

(2) Since the heat-treatment step is performed at a temperature of less than 900 degrees C., the thermal diffusion of boron from the silicon wafer into the epitaxial film can be restrained.

(3) With a simple process of substituting the oxygen concentration of the silicon wafer 2, the resistivity of the silicon wafer 2, the film thickness of the epitaxial film 3 and the heat treatment temperature in the above formula (1) to calculate the heat treatment time, the epitaxial silicon wafer 1 capable of restraining the dislocation extension can be manufactured.

Modification(s)

It should be noted that the scope of the invention is not limited to the above exemplary embodiment(s), but various improvements and design modifications are possible as long as such improvements and design modifications are compatible with an object of the invention.

Specifically, without using the heat treatment time calculated based on the formula (1) in the heat-treatment step, the heat treatment conditions may be set within the temperature range of less than 900 degrees C. so that the epitaxial silicon wafer 1 whose average oxygen concentration of the epitaxial film 3 is adjusted to be $1.7 \times 10^{17}$ atoms/cm$^3$ (according to ASTM F-121, 1979) or more is producible, based on experiments performed under a plurality of conditions.

Further, the oxygen concentration of the silicon wafer 2 may be less than $8 \times 10^{17}$ atoms/cm$^3$ or may exceed $18 \times 10^{17}$ atoms/cm$^3$ (according to ASTM F-121, 1979),

EXAMPLES

Next, the invention will be described in detail below with reference to Examples. However, it should be understood that the scope of the invention is by no means limited by the Examples.

Experiment 1

A monocrystal ingot was manufactured using the CZ (Czochralski) process from silicon melt doped with boron. A silicon wafer was cut from the monocrystal ingot. The oxygen concentration of the silicon wafer (sometimes referred to as "substrate oxygen concentration" hereinafter) was $11 \times 10^{17}$ atoms/cm$^3$. The resistivity of the silicon wafer (sometimes referred to as "substrate resistivity" hereinafter) was 5 mΩ·cm. Another silicon wafer with the substrate resistivity of 10 Ω·cm was prepared.

Next, a (100) surface of the silicon wafer was processed to provide a mirror polished surface. Then, an epitaxial film of 3 μm film thickness (sometimes referred to as "epitaxial film thickness" hereinafter) was grown on the mirror polished surface. The epitaxial film was grown under a gas atmosphere (e.g. trichlorosilane) at a temperature of approximately 1150 degrees C.

Then, the heat-treatment step was performed on the wafer on which the epitaxial film had been grown, in which the wafer was held for 60 minutes at 850 degrees C. in a non-acidic atmosphere to obtain an epitaxial silicon wafer.

Another epitaxial silicon wafer without being subjected to the heat treatment was also prepared.

Stress tests were applied on the manufactured epitaxial silicon wafers. Initially, a measurement sample pieces (length: 3 cm, width: 1.5 cm) were cut from each of the epitaxial silicon wafers. Next, a 5 g load (measured by a micro Vickers hardness tester) was applied on a surface of each of the measurement samples (surface of the epitaxial film) and held for 10 seconds to provide indentations of 3 μm. depth. Then, the measurement samples are subjected to a three-point bending test (distance between support points: 2 cm, test temperature: 800 degrees C.). At this time, a 5N load was applied so that a tensile force acted on the surface of each of the measurement samples.

Subsequently, a 2 μm Wright-etching was applied on each of the measurement samples having been cooled to the ambient temperature to check the presence of dislocation pits generated from the indentations provided on the epitaxial film and observed on the surface of the epitaxial film using an optical microscope. The measurement results are shown in Table 1.

Figure 3:
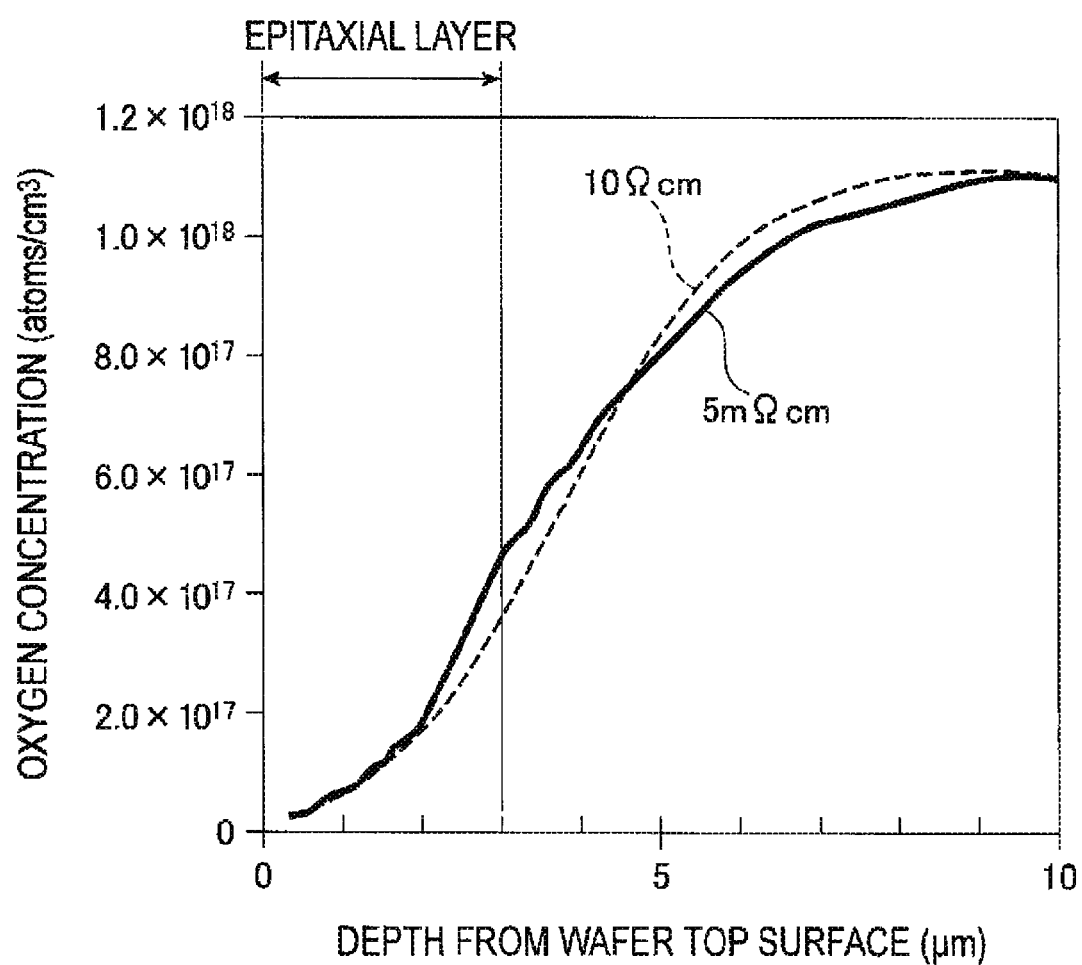
FIG. 3 is a graph showing a depth profile of an oxygen concentration in an example (Experiment 1), in which a heat treatment is applied at 850 degrees C.

Further, depth profiles of the oxygen concentration for the manufactured epitaxial silicon wafers subjected to the heat treatment were measured. The oxygen concentration was measured using an SIMS (secondary ion mass spectroscope). The depth profiles are shown in FIG. 3.

TABLE 1

| | Epitaxial Film | | | | |
|---|---|---|---|---|---|
| | Substrate | | | | |
| Film Thickness (μm) | Oxygen Concentration ($\times 10^{17}$ atoms/cm$^3$) | Resistivity | Heat-Treatment Step | | Dislocation Extension No: ○ Yes: x |
| | | | Temperature (° C.) | Time (Min.) | |
| 3 | 11 | 5 mΩ · cm | N/A | N/A | x |
| 3 | 11 | 5 mΩ · cm | 850 | 60 | ○ |
| 3 | 11 | 10 Ω · cm | N/A | N/A | x |
| 3 | 11 | 10 Ω · cm | 850 | 60 | x |

As shown in Table 1, it is found that the dislocation extension from the indentations did not occur and the strength of the epitaxial film was increased when the heat treatment was applied after forming the epitaxial film and the substrate resistivity was 5 mΩ·cm. On the other hand, when the substrate resistivity was 10 Ω·cm, it is found that the dislocation extension from the indentations was observed and a strength of the epitaxial film was low even after the heat-treatment step at the same heat treatment temperature.

It should be noted that all of the wafers not having been subjected to the heat-treatment step exhibited the dislocation extension at both of the resistivity levels, and it is found that the strength of the epitaxial film was low.

As shown in FIG. 3, when the two instances are compared, it is found that, though the oxygen concentration of the substrate of an instance in which the substrate resistivity was 5 mΩ·cm shows a decreasing profile, the profile also shows that the oxygen concentration in the epitaxial film locally increased.

Experiment 2

The epitaxial silicon wafer was manufactured under the same conditions as those in Experiment 1 except that the heat treatment temperature was changed to 900 degrees C. The depth profile of the oxygen concentration was measured for the manufactured epitaxial silicon wafers that were subjected to the heat-treatment step. The depth profiles are shown in FIG. 4.

TABLE 2

| | Epitaxial Film | | | |
|---|---|---|---|---|
| | Substrate | | | |
| Film Thickness (μm) | Oxygen Concentration ($\times 10^{17}$ atoms/cm$^3$) | Resistivity | Heat-Treatment Step | |
| | | | Temperature (° C.) | Time (Min.) |
| 3 | 11 | 5 mΩ · cm | N/A | N/A |
| 3 | 11 | 5 mΩ · cm | 900 | 60 |
| 3 | 11 | 10 Ω · cm | N/A | N/A |
| 3 | 11 | 10 Ω · cm | 900 | 60 |

Figure 4:
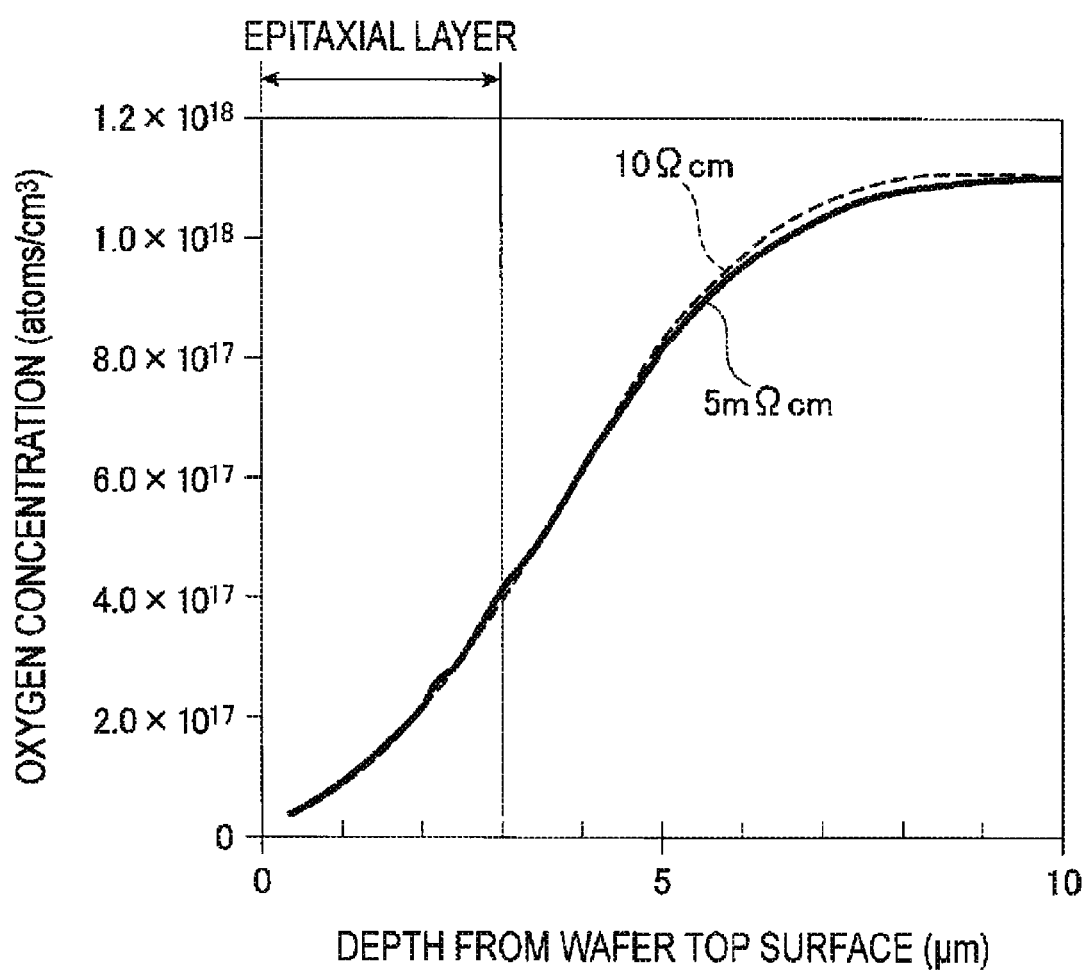
FIG. 4 is a graph showing a depth profile of an oxygen concentration in an example (Experiment 2), in which a heat treatment is applied at 900 degrees C.

As shown in FIG. 4, when the heat treatment temperature was 900 degrees C., oxygen-concentration profile of the epitaxial film on a low-resistivity substrate did not show the locally increasing oxygen concentration profile.

Figure 5:
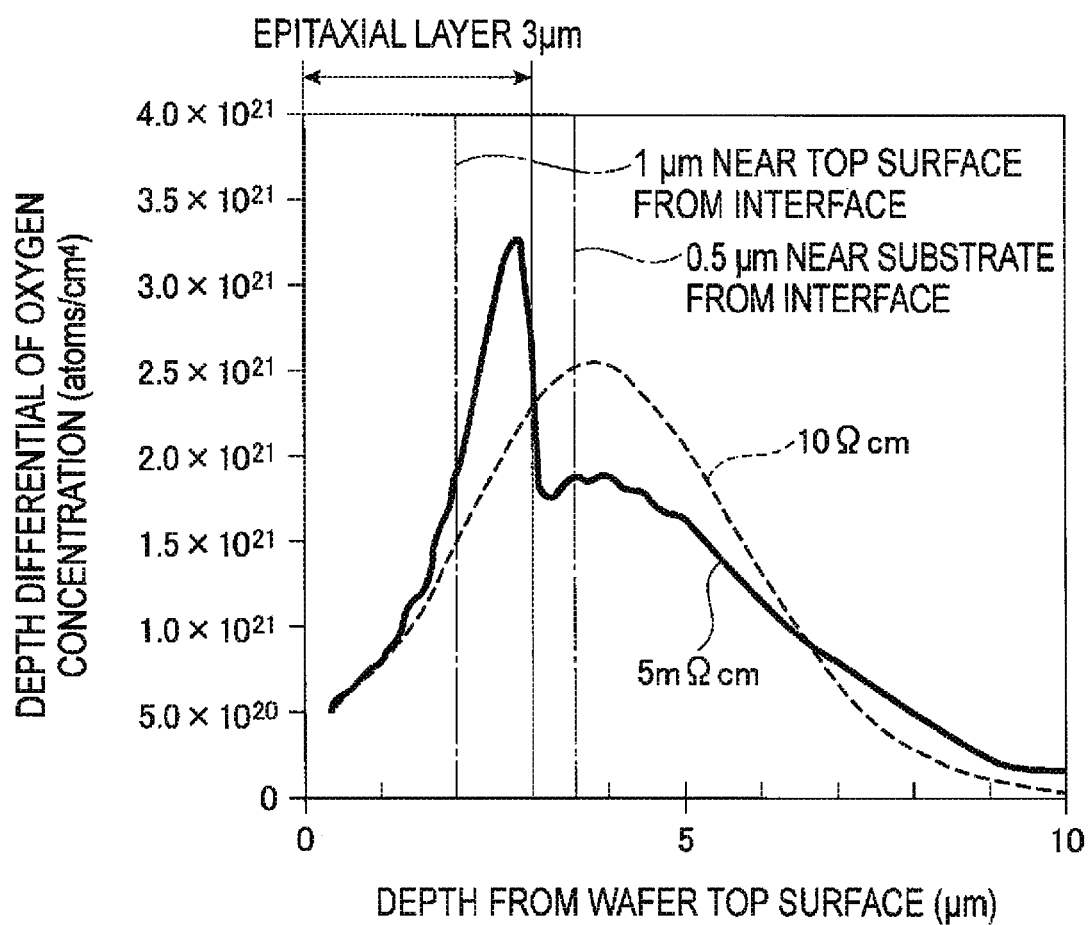
FIG. 5 is a graph showing a depth profile of a depth differential of the oxygen concentration in the example (Experiment 1), in which the heat treatment is applied at 850 degrees C.
Figure 6:
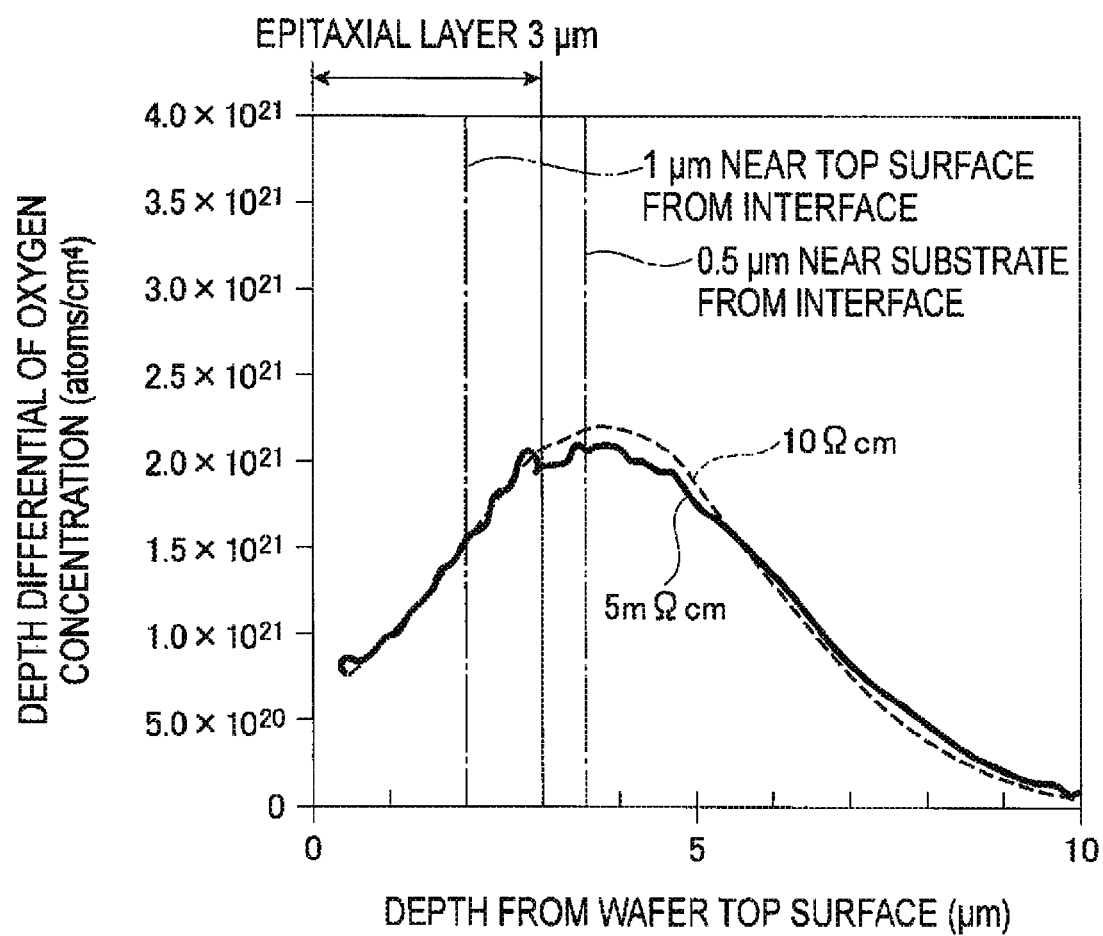
FIG. 6 is a graph showing a depth profile of a depth differential of the oxygen concentration in the example (Experiment 2), in which the heat treatment is applied at 900 degrees C.

Next, the depth profiles of depth differentials (atoms/c of the oxygen concentration for the manufactured epitaxial silicon wafers subjected to the heat treatment in the Experiments 1 and 2 were measured. The depth profiles are shown in FIGS. 5 and 6. As shown in FIG. 5, in the Experiment 1 in which the heat treatment at 850 degrees C. was applied, a local peak of the depth profile of the depth differential of the oxygen concentration was observed in the vicinity of an interface in an instance in which a silicon wafer of the substrate resistivity of 5 mΩ·cm was used. The local peak of the depth profile of the depth differential of the oxygen concentration shows that the oxygen concentration locally increases in the vicinity of the interface, and it is speculated that Table 1 shows no dislocation extension was caused from the indentations and thus the strength of the epitaxial film was high.

On the other hand, both of the instance shown in FIG. 5 in which a silicon wafer of the substrate resistivity of 10 Ω·cm was used and the instance shown in FIG. 6 in which the heat treatment at 900 degrees C. was applied in Experiment 2 show broad peaks, Experiment 3

An epitaxial silicon wafer was prepared under the same conditions as those in Experiment 1 except that the heat treatment temperature was changed to 1000 degrees C. Further, an epitaxial silicon wafer was prepared at a heat treatment temperature of 850 degrees C. in the same manner as in Experiment 1. The depth profile of boron concentration for the prepared epitaxial silicon wafer was measured. The depth profile of the boron concentration was measured using an SIMS (secondary ion mass spectroscope). The depth profiles are shown in FIG. 7.

Figure 7:
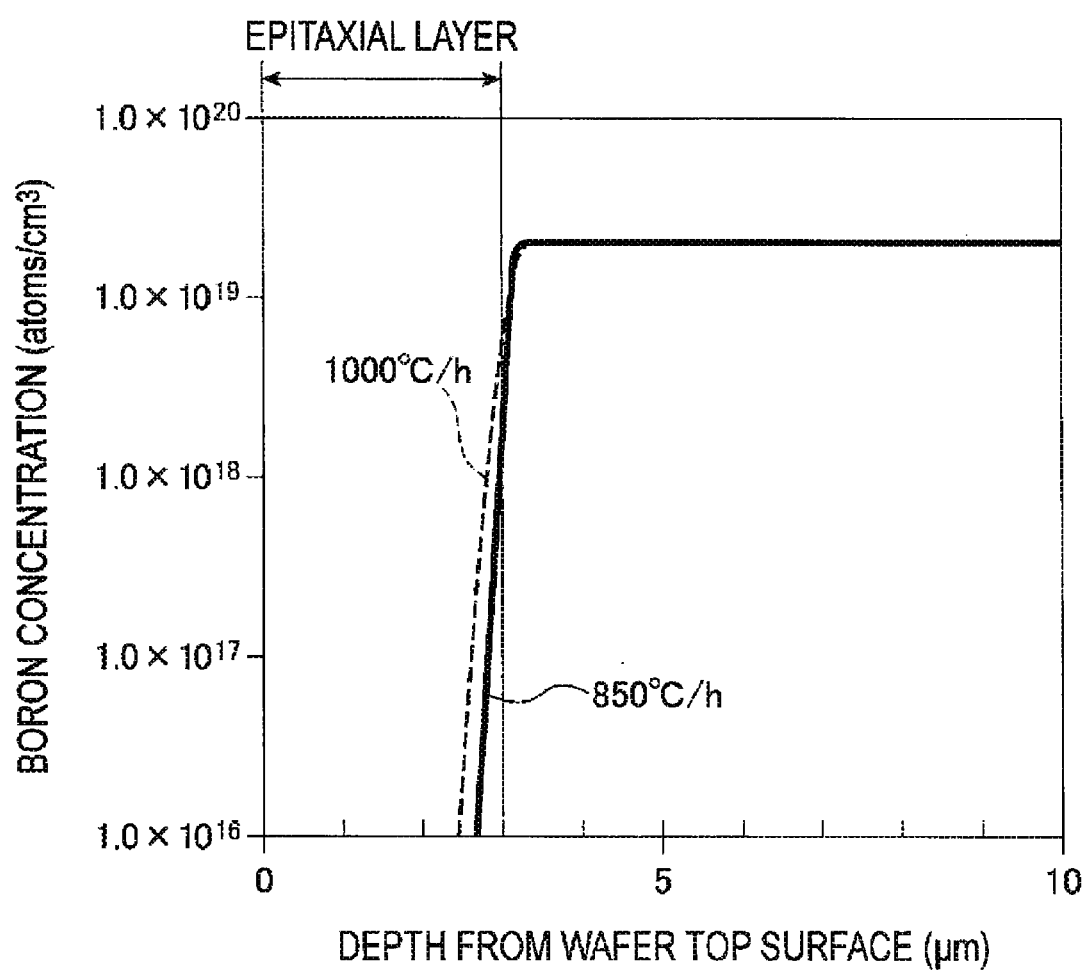
FIG. 7 is a graph showing a depth profile of a boron concentration in Experiment

As shown in FIG. 7, while the wafer subjected to the heat treatment at 850 degrees C. exhibited small boron diffusion toward the epitaxial film, the wafer subjected to the heat treatment at 1000 degrees C. exhibited large boron diffusion toward the epitaxial film.

Experiment 4

Figure 8:
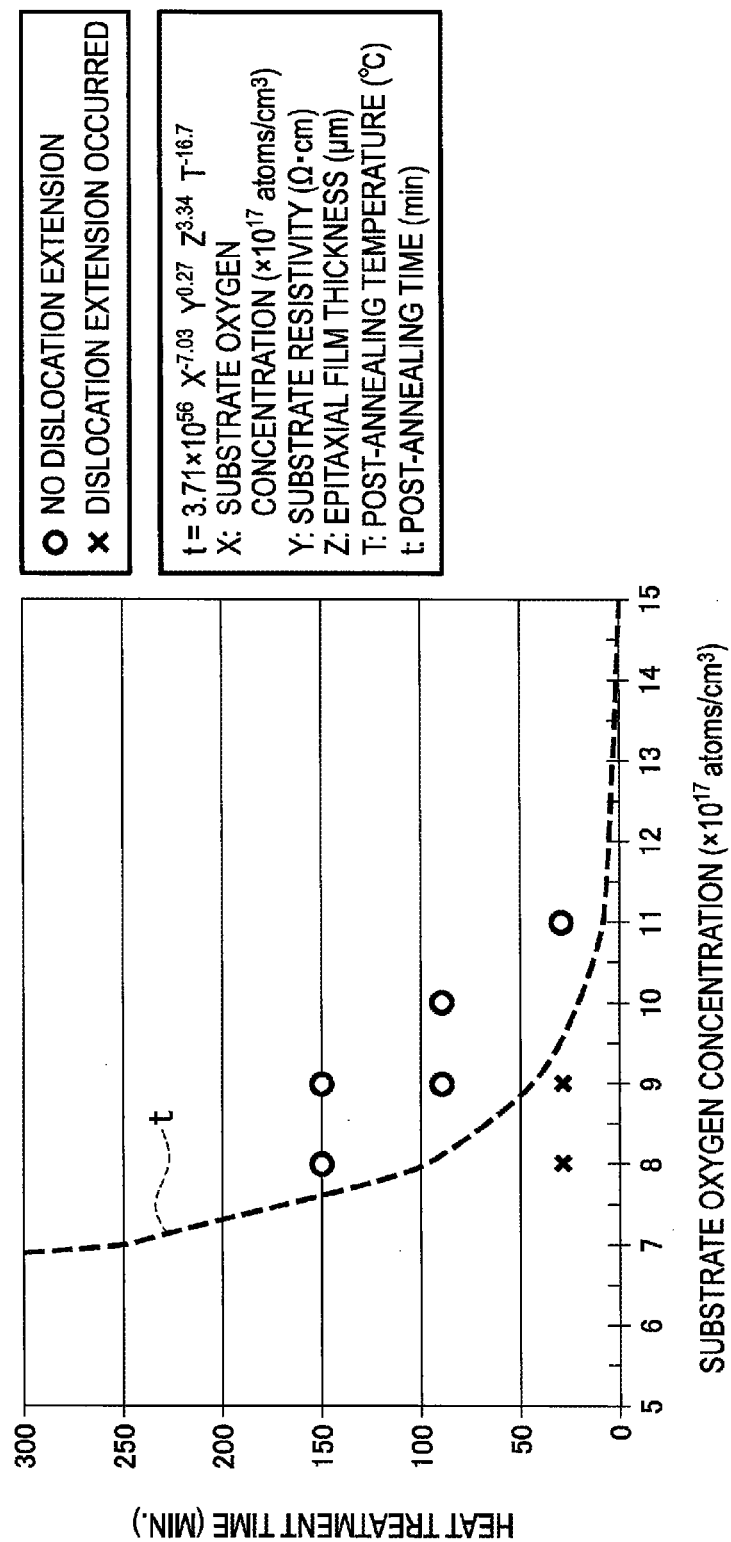
FIG. 8 is a graph showing a result of a stress test in Experiment 4.

Except that the epitaxial film thickness, the substrate oxygen concentration and the substrate resistivity were set as in Table 3 below, the heat treatment temperature was 890 degrees C. and the heat treatment time was variously changed, the epitaxial silicon wafers were prepared and the stress test was performed under the same conditions as those in Experiment 1, and the dislocation pits observable on the surface of the epitaxial film were measured. The measurement results are shown in Table 3. The results of the stress tests are shown in FIG. 8. It should be noted that the curve in FIG. 8 is an approximate curve showing a border of the presence/absence of the dislocation extension derived from the above formula (1).

TABLE 3

| | Epitaxial Film | | | | |
|---|---|---|---|---|---|
| | Substrate | | | | |
| Film Thickness (μm) | Oxygen Concentration ($\times 10^{17}$ atoms/cm$^3$) | Resistivity (mΩ · cm) | Heat-Treatment Step | | Dislocation Extension No: ○ Yes: x |
| | | | Temperature (° C.) | Time (Min.) | |
| 3 | 8 | 5 | 890 | 30 | x |
| 3 | 8 | 5 | 890 | 150 | ○ |
| 3 | 9 | 5 | 890 | 30 | x |
| 3 | 9 | 5 | 890 | 90 | ○ |
| 3 | 9 | 5 | 890 | 150 | ○ |
| 3 | 10 | 5 | 890 | 90 | ○ |
| 3 | 11 | 5 | 890 | 30 | ○ |

As shown in Table 3, it was found that the dislocation extension from the indentations did not occur and the strength of the epitaxial film was improved when the heat treatment temperature was 890 degrees.

Further, as is clear from FIG. 8, the border between the presence and absence of the dislocation extension is at the approximate curve, and it is observable that the dislocation extension tends to occur when the heat treatment time is shorter than the time indicated by the approximate curve.

Experiment 5

Except that the epitaxial film thickness, the substrate oxygen concentration and the substrate resistivity were set as in Table 4 below, the heat treatment temperature was 850 degrees C. and the heat treatment time was variously changed, the epitaxial silicon wafers were prepared and the stress test was performed under the same conditions as those in Experiment 1, and the dislocation pits observable on the surface of the epitaxial film were measured.

Figure 9:
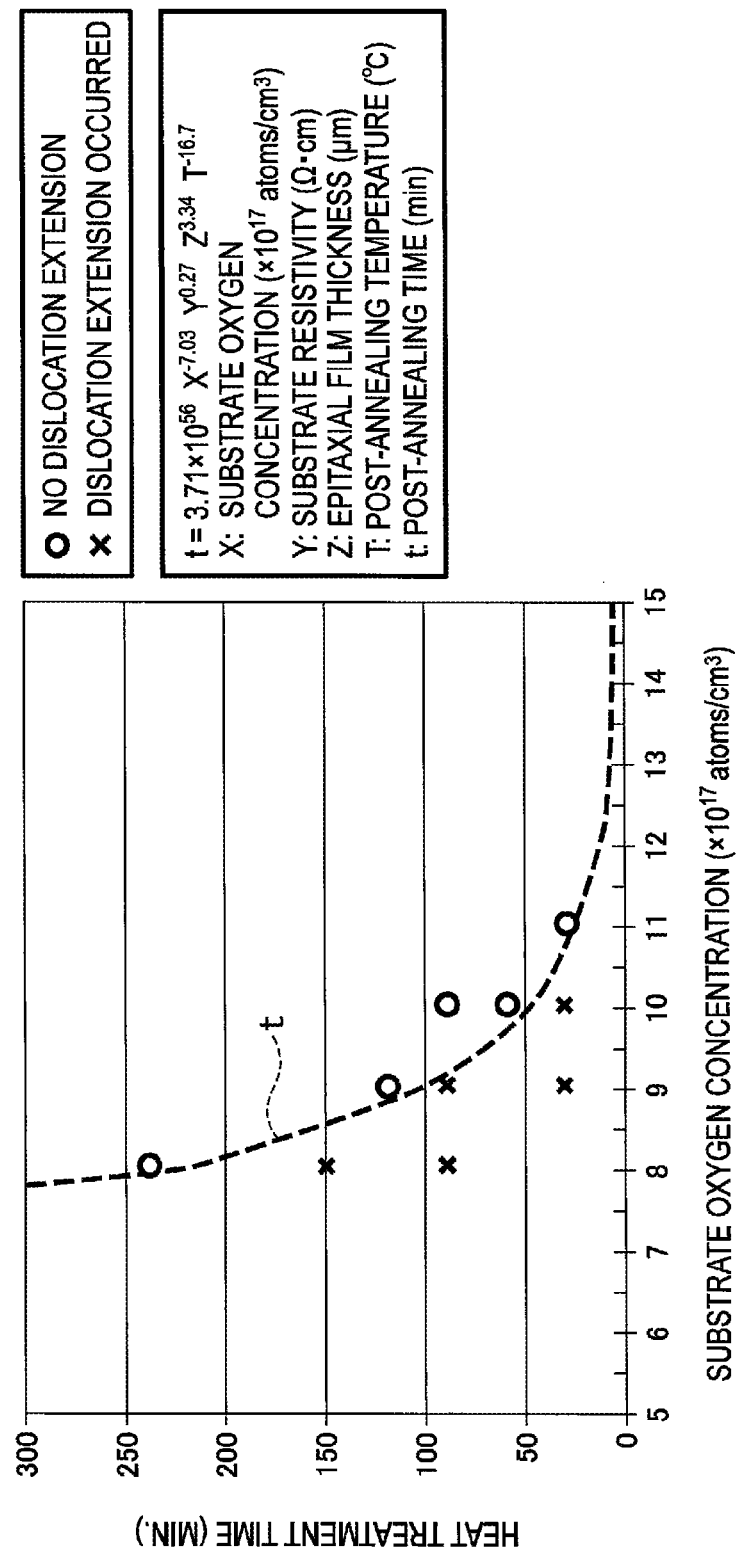
FIG. 9 is a graph showing a result of a stress test in an example (Experiment 5), in which a silicon wafer having resistivity of 5 mΩ·cm was used.
Figure 10:
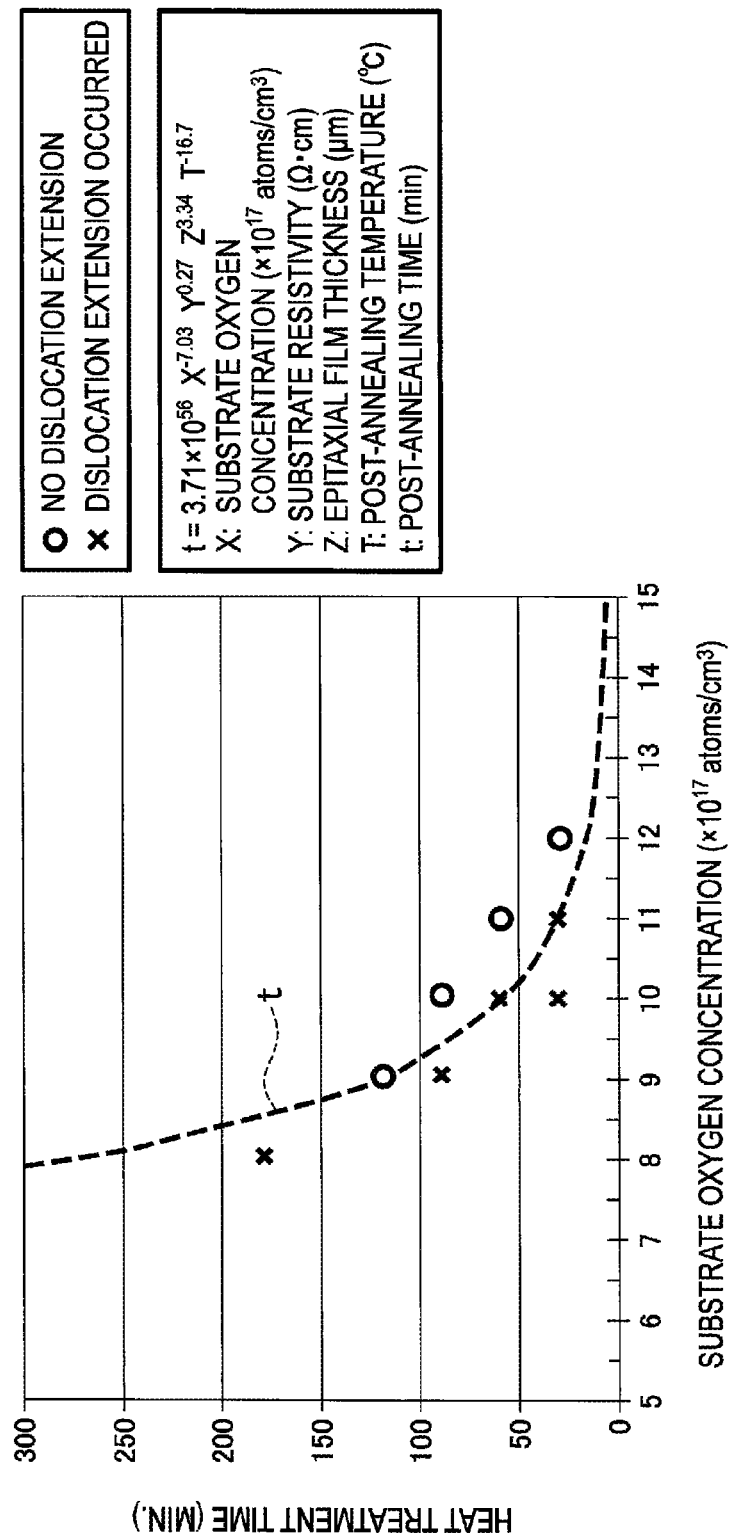
FIG. 10 is a graph showing a result of a stress test in an example (Experiment in which a silicon wafer having resistivity of 10 mΩ·cm was used.
Figure 11:
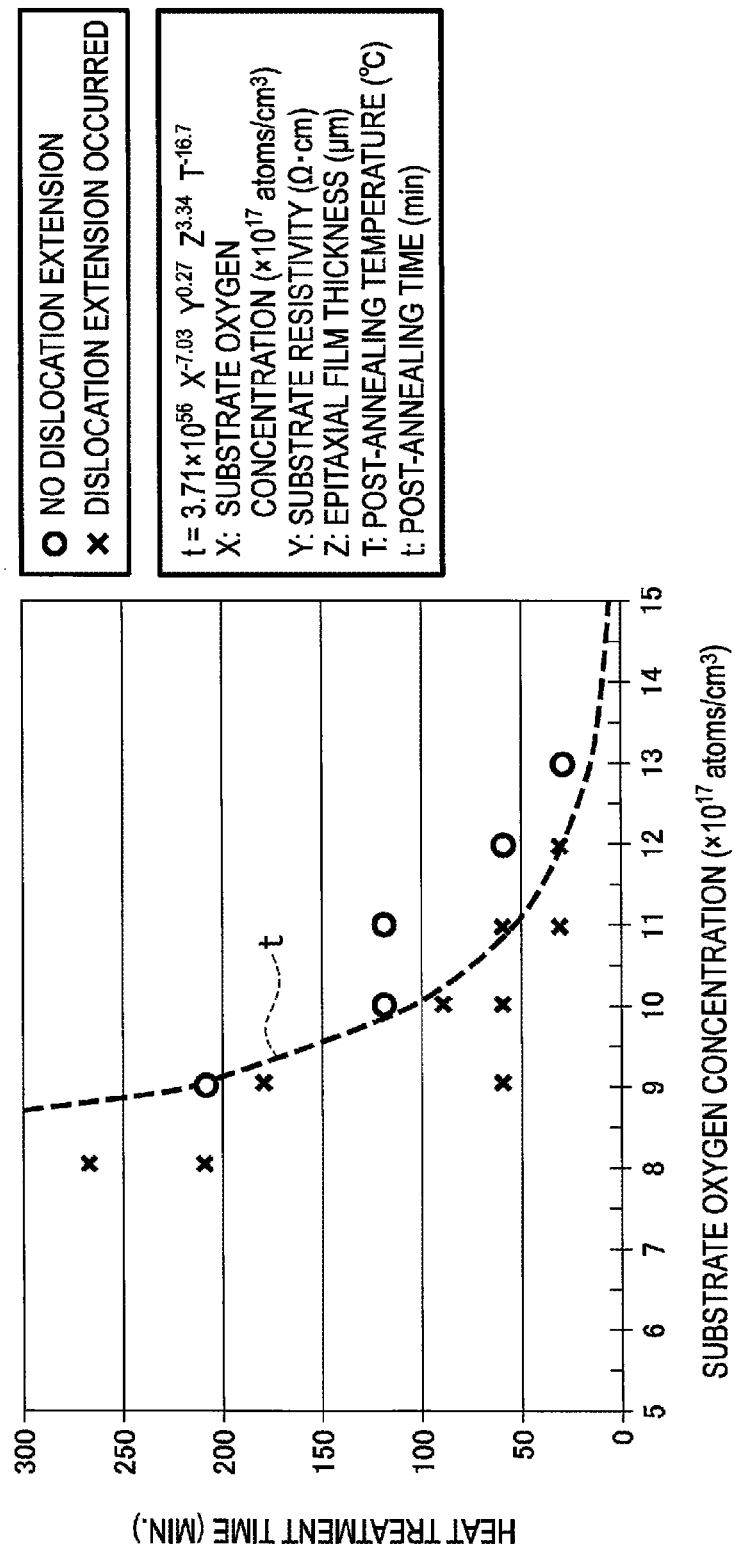
FIG. 11 is a graph showing a result of a stress test in an example (Experiment 5), in which a silicon wafer having resistivity of 100 mΩ·cm was used.

In an instance using a silicon wafer whose substrate resistivity was 5 mΩ·cm, an average oxygen concentration of the epitaxial film was measured. The measurement results are shown in Table 4. The results of the stress tests are shown in FIGS. 9 to 11. It should be noted that the curves in FIGS. 9-11 are approximate curves derived from the above formula (1).

TABLE 4

| | Epitaxial Film | | | | | |
|---|---|---|---|---|---|---|
| | Substrate | | | | Dislocation | Average Oxygen |
| Film Thickness (μm) | Oxygen Concentration ($\times 10^{17}$ atoms/cm$^3$) | Resistivity (mΩ · cm) | Heat-Treatment Step | | Extension No: ○ Yes: x | Concentration of Epitaxial Film ($\times 10^{17}$ atoms/cm$^3$) |
| | | | Temperature (° C.) | Time (Min.) | | |
| 3 | 8 | 5 | 850 | 90 | x | 1.48 |
| 3 | 8 | 5 | 850 | 150 | x | 1.68 |
| 3 | 8 | 5 | 850 | 240 | ○ | 1.93 |
| 3 | 9 | 5 | 850 | 30 | x | 1.40 |
| 3 | 9 | 5 | 850 | 90 | x | 1.67 |
| 3 | 9 | 5 | 850 | 120 | ○ | 1.79 |
| 3 | 10 | 5 | 850 | 30 | x | 1.57 |
| 3 | 10 | 5 | 850 | 60 | ○ | 1.72 |
| 3 | 10 | 5 | 850 | 90 | ○ | 1.87 |
| 3 | 11 | 5 | 850 | 30 | ○ | 1.73 |
| 3 | 8 | 10 | 850 | 180 | x | 1.51 |
| 3 | 9 | 10 | 850 | 90 | x | 1.59 |
| 3 | 9 | 10 | 850 | 120 | ○ | 1.71 |
| 3 | 10 | 10 | 850 | 30 | x | 1.66 |
| 3 | 10 | 10 | 850 | 60 | x | 1.67 |
| 3 | 10 | 10 | 850 | 90 | ○ | 1.72 |
| 3 | 11 | 10 | 850 | 30 | x | 1.69 |
| 3 | 11 | 10 | 850 | 60 | ○ | 1.82 |
| 3 | 12 | 10 | 850 | 30 | ○ | 1.82 |
| 3 | 8 | 100 | 850 | 210 | x | 1.38 |
| 3 | 8 | 100 | 850 | 270 | x | 1.52 |
| 3 | 9 | 100 | 850 | 60 | x | 1.55 |
| 3 | 9 | 100 | 850 | 180 | x | 1.58 |
| 3 | 9 | 100 | 850 | 210 | ○ | 1.70 |
| 3 | 10 | 100 | 850 | 60 | x | 1.67 |
| 3 | 10 | 100 | 850 | 90 | x | 1.68 |
| 3 | 10 | 100 | 850 | 120 | ○ | 1.71 |
| 3 | 11 | 100 | 850 | 30 | x | w/o |
| 3 | 11 | 100 | 850 | 60 | x | w/o |
| 3 | 11 | 100 | 850 | 120 | ○ | w/o |
| 3 | 12 | 100 | 850 | 30 | x | w/o |
| 3 | 12 | 100 | 850 | 60 | ○ | w/o |
| 3 | 13 | 100 | 850 | 30 | ○ | w/o |

Experiment 6

Figure 12:
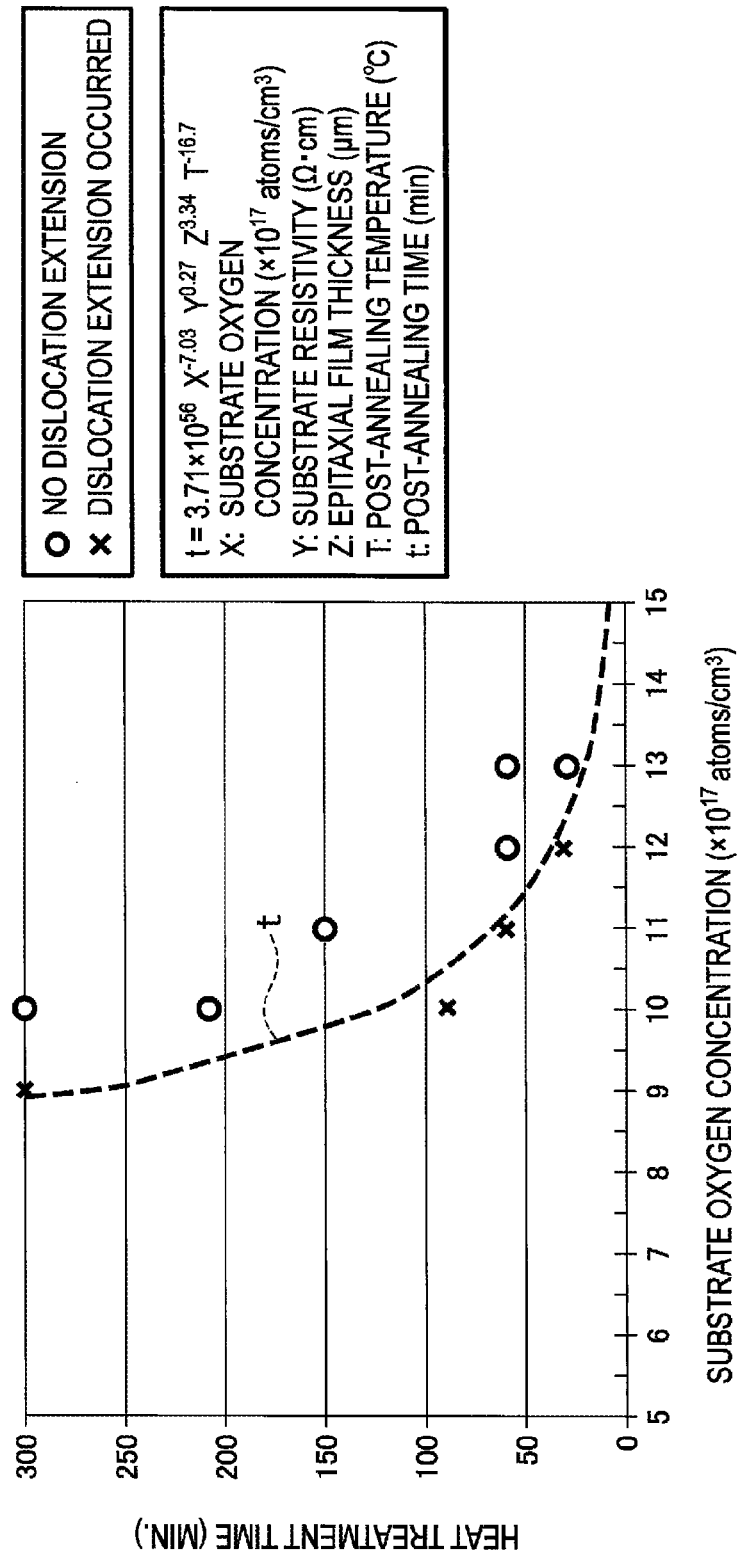
FIG. 12 is a graph showing a result of a stress test in an example (Experiment 6), in which a silicon wafer having resistivity of 5 mΩ·cm was used.
Figure 13:
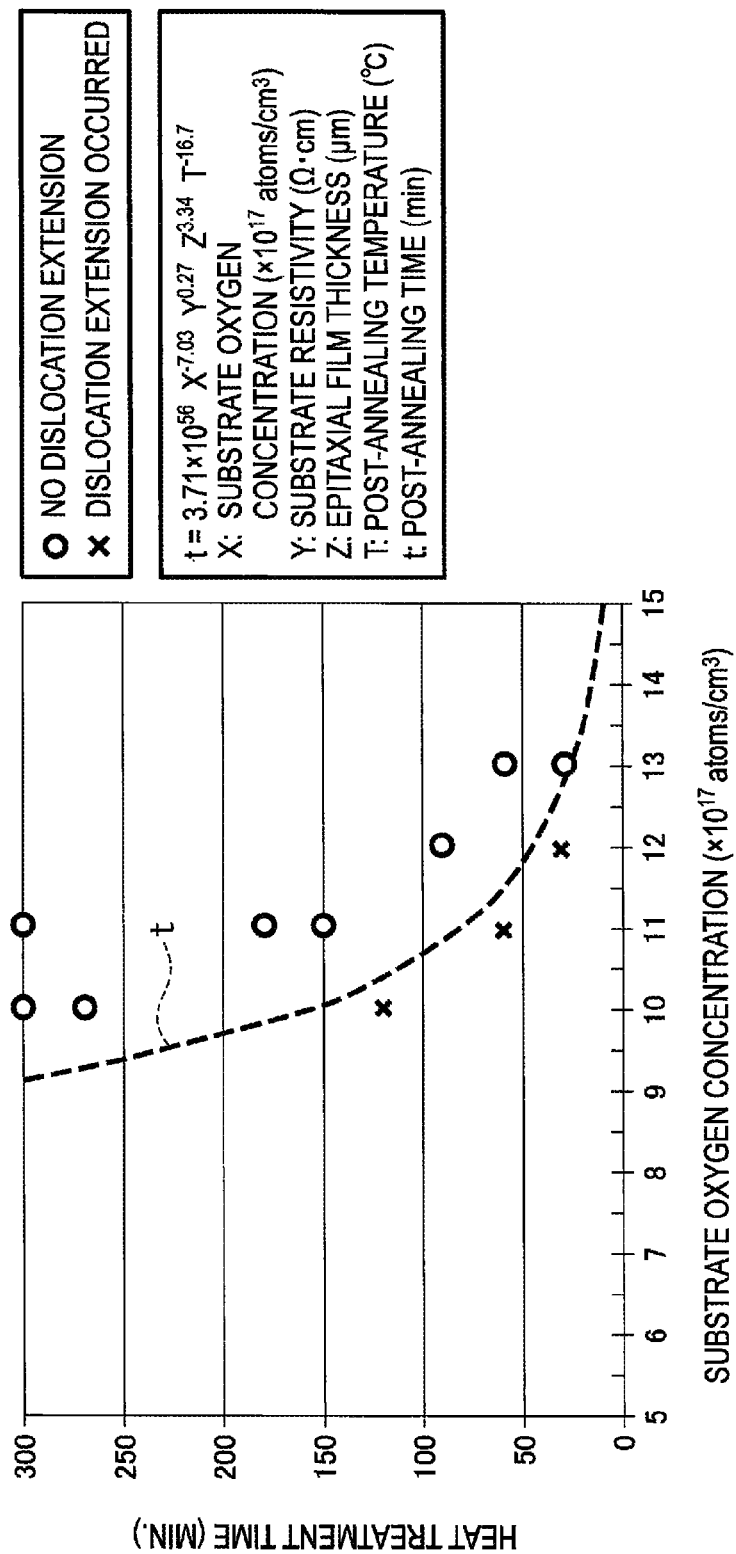
FIG. 13 is a graph showing a result of a stress test in an example (Experiment 6), in which a silicon wafer having resistivity of 10 mΩ·cm was used.
Figure 14:
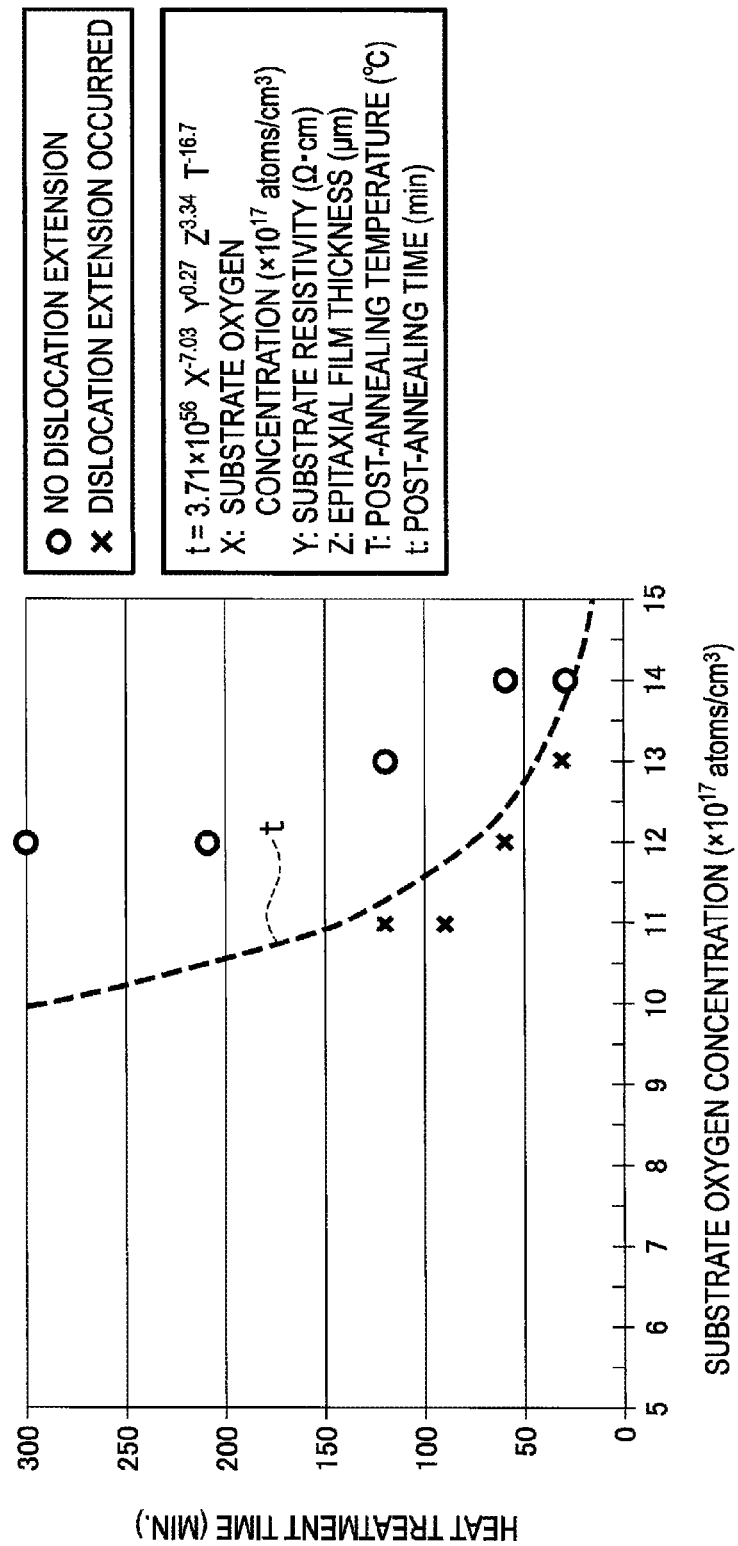
FIG. 14 is a graph showing a result of a stress test in an example (Experiment 6), in which a silicon wafer having resistivity of 100 Ω·cm was used.

Except that the epitaxial film thickness, the substrate oxygen concentration and the substrate resistivity were set as in Table 5 below, the heat treatment temperature was 800 degrees C. and the heat treatment time was variously changed, the epitaxial silicon wafers were prepared and the stress test was performed under the same conditions as those in Experiment 1, and the dislocation pits observable on the surface of the epitaxial film were measured. The measurement results are shown in Table 5. The results of the stress tests are shown in FIGS. 12 to 14. It should be noted that the curves in FIGS. 12-14 are approximate curves derived from the above formula (1).

TABLE 5

| | Epitaxial Film | | | | |
|---|---|---|---|---|---|
| | Substrate | | | Heat-Treatment Step | | Dislocation |
| Film Thickness (μm) | Oxygen Concentration (×10$^{17}$ atoms/cm$^3$) | Resistivity (mΩ·cm) | Temperature (° C.) | Time (Min.) | Extension No: ○ Yes: x |
| 3 | 9 | 5 | 800 | 300 | x |
| 3 | 10 | 5 | 800 | 90 | x |
| 3 | 10 | 5 | 800 | 210 | ○ |
| 3 | 10 | 5 | 800 | 300 | ○ |
| 3 | 11 | 5 | 800 | 60 | x |
| 3 | 11 | 5 | 800 | 150 | ○ |
| 3 | 12 | 5 | 800 | 30 | x |
| 3 | 12 | 5 | 800 | 60 | ○ |
| 3 | 13 | 5 | 800 | 30 | ○ |
| 3 | 13 | 5 | 800 | 60 | ○ |
| 3 | 10 | 10 | 800 | 120 | x |
| 3 | 10 | 10 | 800 | 270 | ○ |
| 3 | 10 | 10 | 800 | 300 | ○ |
| 3 | 11 | 10 | 800 | 60 | x |
| 3 | 11 | 10 | 800 | 150 | ○ |
| 3 | 11 | 10 | 800 | 180 | ○ |
| 3 | 11 | 10 | 800 | 300 | ○ |
| 3 | 12 | 10 | 800 | 30 | x |
| 3 | 12 | 10 | 800 | 90 | ○ |
| 3 | 13 | 10 | 800 | 30 | ○ |
| 3 | 13 | 10 | 800 | 60 | ○ |
| 3 | 11 | 100 | 800 | 90 | x |
| 3 | 11 | 100 | 800 | 120 | x |
| 3 | 12 | 100 | 800 | 60 | x |
| 3 | 12 | 100 | 800 | 210 | ○ |
| 3 | 12 | 100 | 800 | 300 | ○ |
| 3 | 13 | 100 | 800 | 30 | x |
| 3 | 13 | 100 | 800 | 120 | ○ |
| 3 | 14 | 100 | 800 | 30 | ○ |
| 3 | 14 | 100 | 800 | 60 | ○ |

Experiment 7

Figure 15:
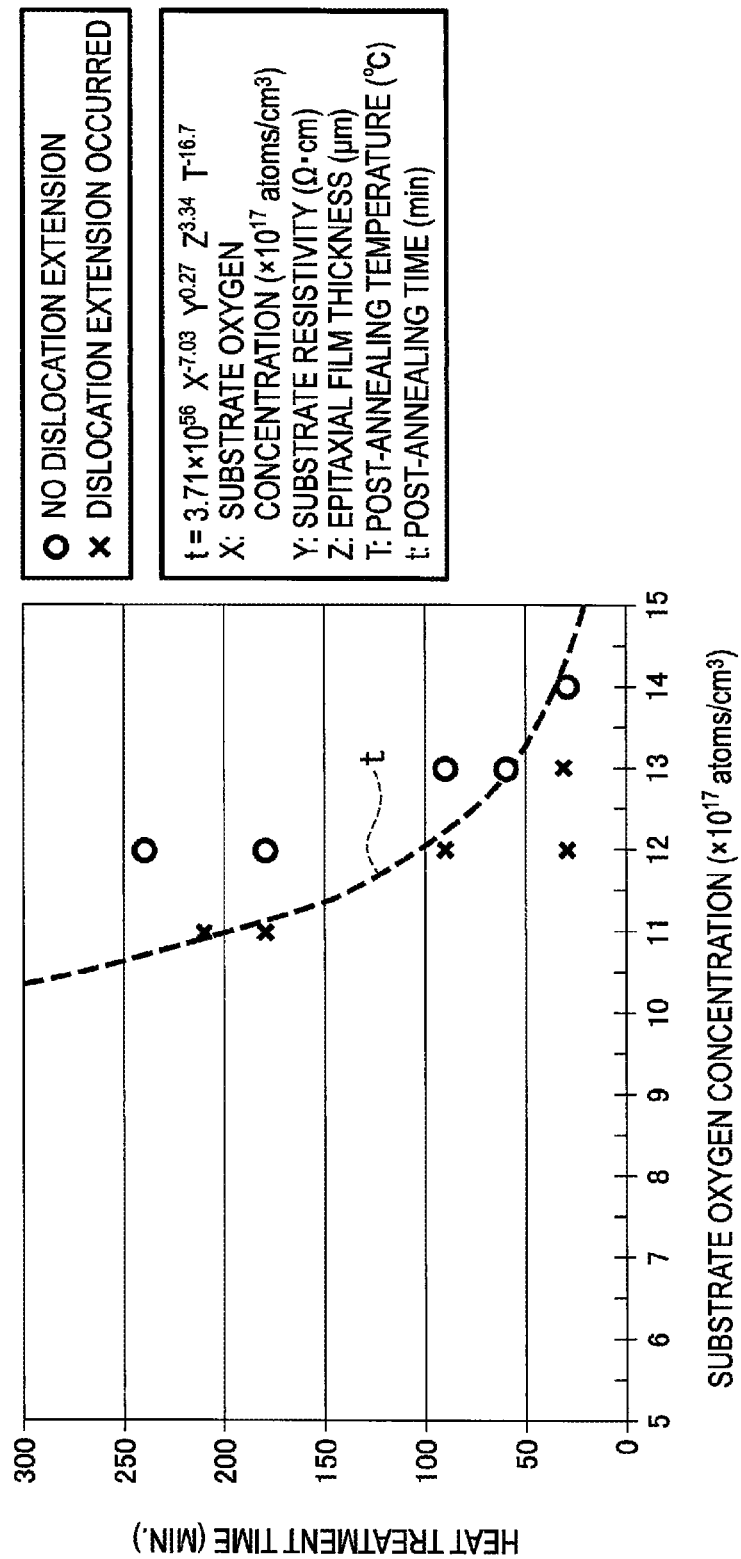
FIG. 15 is a graph showing a result of a stress test in an example (Experiment 7), in which a silicon wafer having resistivity of 5 mΩ·cm was used.
Figure 16:
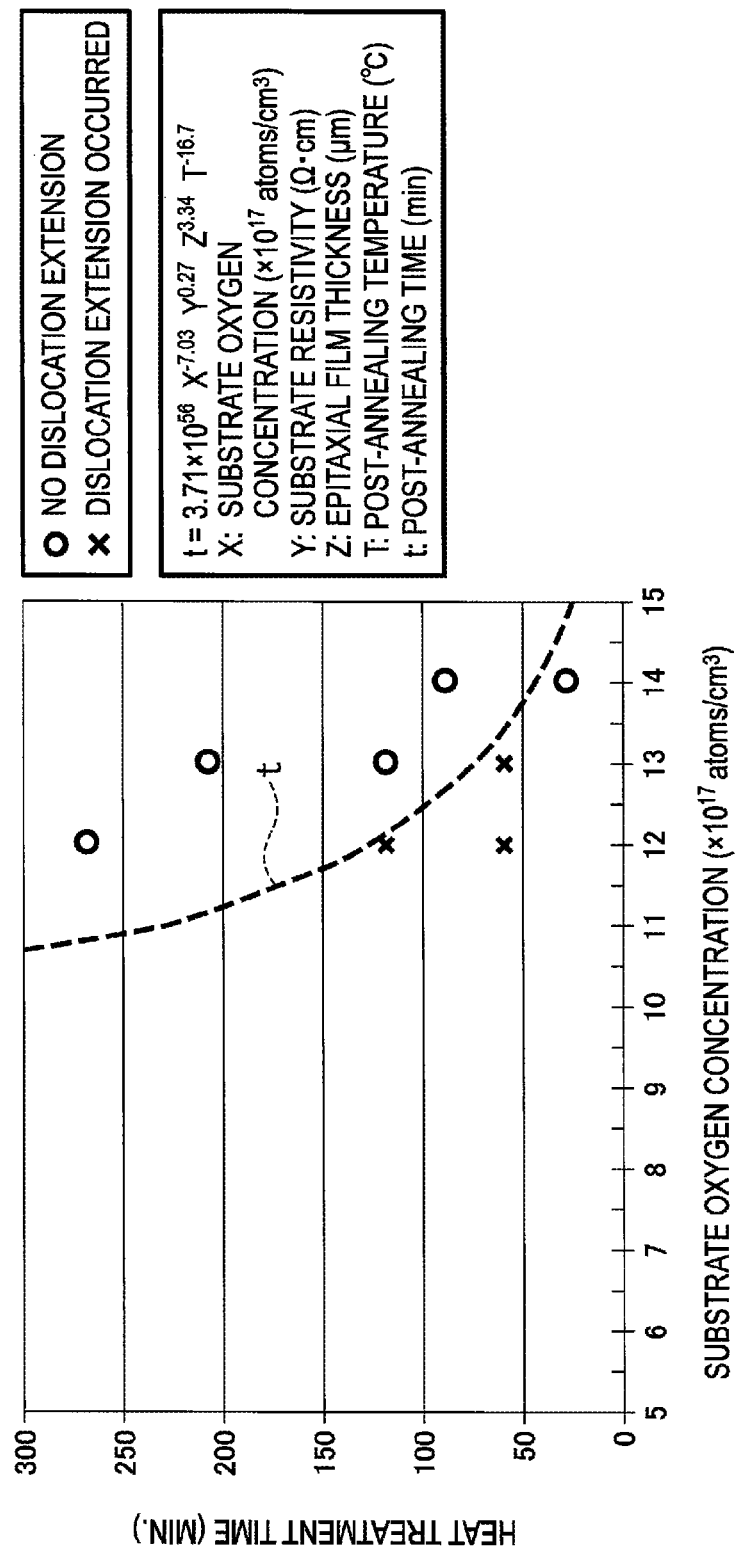
FIG. 16 is a graph showing a result of a stress test in an example (Experiment 7), in which a silicon wafer having resistivity of 10 mΩ·cm was used.
Figure 17:
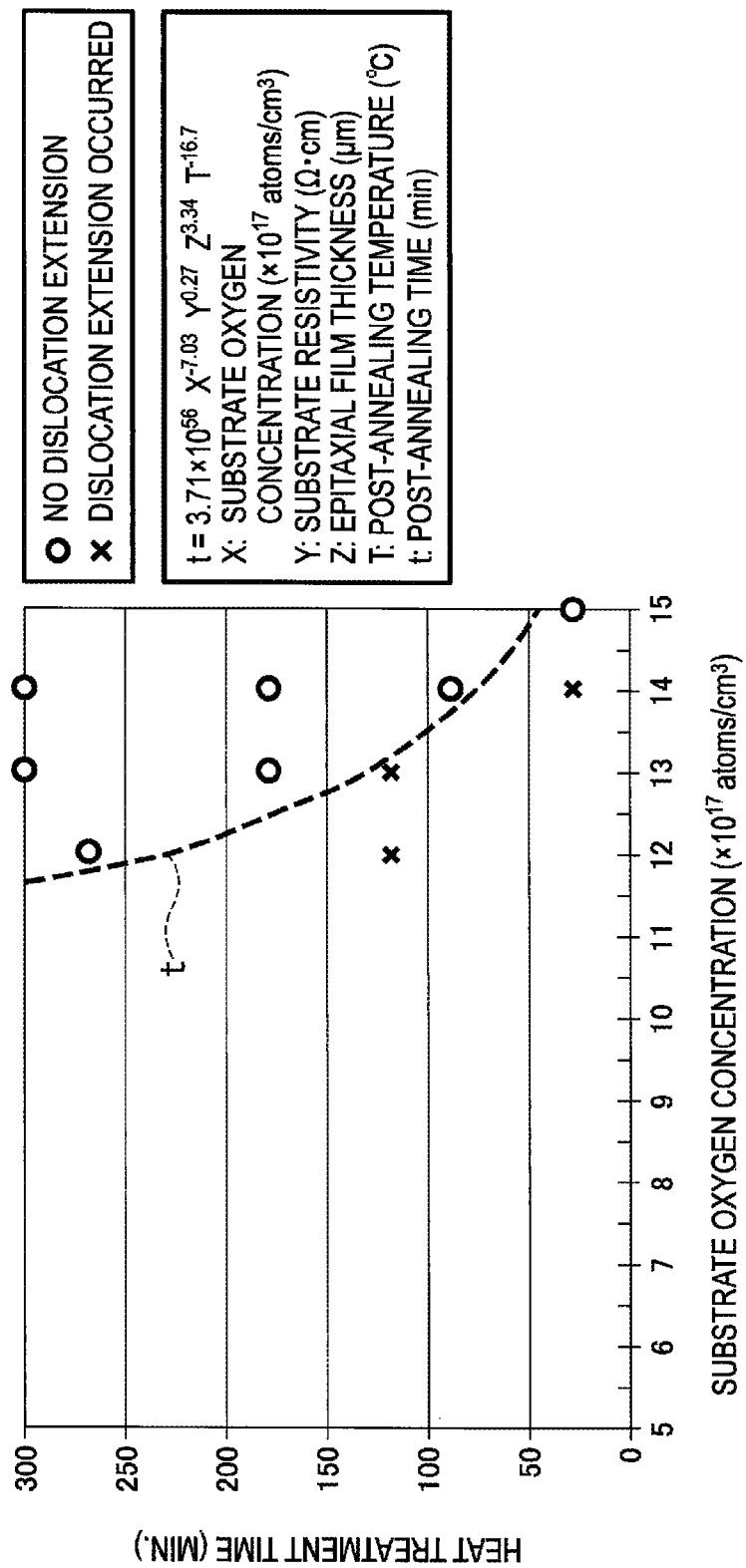

Except that the epitaxial film thickness, the substrate oxygen concentration and the substrate resistivity were set as in Table 6 below, the heat treatment temperature was 750 degrees C. and the heat treatment time was variously changed, the epitaxial silicon wafers were prepared and the stress test was performed under the same conditions as those in Experiment 1, and the dislocation pits observable on the surface of the epitaxial film were measured. The measurement results are shown in Table 6. The results of the stress tests are shown in FIGS. 15 to 17. It should be noted that the curves in FIGS. 15-17 are approximate curves derived from the above formula (1).

TABLE 6

| | Epitaxial Film | | | | |
|---|---|---|---|---|---|
| | Substrate | | | Heat-Treatment Step | | Dislocation |
| Film Thickness (μm) | Oxygen Concentration (×10$^{17}$ atoms/cm$^3$) | Resistivity (mΩ·cm) | Temperature (° C.) | Time (Min.) | Extension No: ○ Yes: x |
| 3 | 11 | 5 | 750 | 180 | x |
| 3 | 11 | 5 | 750 | 210 | x |
| 3 | 11 | 5 | 750 | 330 | ○ |
| 3 | 12 | 5 | 750 | 30 | x |
| 3 | 12 | 5 | 750 | 90 | x |
| 3 | 12 | 5 | 750 | 180 | ○ |
| 3 | 12 | 5 | 750 | 240 | ○ |
| 3 | 13 | 5 | 750 | 30 | x |
| 3 | 13 | 5 | 750 | 60 | ○ |
| 3 | 13 | 5 | 750 | 90 | ○ |
| 3 | 14 | 5 | 750 | 30 | ○ |
| 3 | 12 | 10 | 750 | 60 | x |
| 3 | 12 | 10 | 750 | 120 | x |
| 3 | 12 | 10 | 750 | 270 | ○ |
| 3 | 13 | 10 | 750 | 60 | x |
| 3 | 13 | 10 | 750 | 120 | ○ |
| 3 | 13 | 10 | 750 | 210 | ○ |
| 3 | 14 | 10 | 750 | 30 | ○ |
| 3 | 14 | 10 | 750 | 90 | ○ |
| 3 | 12 | 100 | 750 | 120 | x |
| 3 | 13 | 100 | 750 | 120 | x |
| 3 | 13 | 100 | 750 | 180 | ○ |
| 3 | 13 | 100 | 750 | 300 | ○ |
| 3 | 14 | 100 | 750 | 30 | x |
| 3 | 14 | 100 | 750 | 90 | ○ |
| 3 | 14 | 100 | 750 | 180 | ○ |
| 3 | 14 | 100 | 750 | 300 | ○ |
| 3 | 15 | 100 | 750 | 30 | ○ |

Experiment 8

Except that the epitaxial film thickness was 2 μm, and the substrate oxygen concentration, the substrate resistivity, the heat treatment temperature and the heat treatment time were set as shown in Table 7 below, epitaxial silicon wafers were manufactured under the same conditions as those in Experiment 1. Further, except that the load applied by a micro Vickers hardness tester was 3 g and the depth of the indentations was 2 μm, the stress test was performed under the some conditions as those in Example 1 and the dislocation pits observed on the surface of the epitaxial film were measured, The measurement results are shown in Table 7. The results of the stress tests are shown in FIG. 18. It should be noted that the curve in FIG. 18 is an approximate curve derived from the above formula (1).

TABLE 7

| | Epitaxial Film | | | | |
|---|---|---|---|---|---|
| | Substrate | | | Heat-Treatment Step | | Dislocation |
| Film Thickness (μm) | Oxygen Concentration (×10$^{17}$ atoms/cm$^3$) | Resistivity (mΩ·cm) | Temperature (° C.) | Time (Min.) | Extension No: ○ Yes: x |
| 2 | 8 | 5 | 850 | 30 | x |
| 2 | 8 | 5 | 850 | 60 | ○ |
| 2 | 8 | 5 | 850 | 60 | ○ |

TABLE 7-continued

| Epitaxial Film | | | | | |
|---|---|---|---|---|---|
| | Substrate | | | | |
| Film Thickness (μm) | Oxygen Concentration (×10¹⁷ atoms/cm³) | Resistivity (mΩ·cm) | Heat-Treatment Step | | Dislocation Extension No: ○ Yes: x |
| | | | Temperature (°C.) | Time (Min.) | |
| 2 | 8 | 5 | 850 | 90 | ○ |
| 2 | 8 | 5 | 850 | 120 | ○ |
| 2 | 9 | 5 | 850 | 30 | ○ |
| 2 | 10 | 5 | 850 | 30 | ○ |

Experiment 9

Except that the epitaxial film thickness was 4 μm, and the substrate oxygen concentration, the substrate resistivity, the heat treatment temperature and the heat treatment time were set as shown in Table 8 below, epitaxial silicon wafers were manufactured under the same conditions as those in Experiment 1. Further, except that the load applied b the micro Vickers hardness tester was 7 g and the depth of the indentations was 4 μm, the stress test was performed under the same conditions as those in Example 1 and the dislocation pits observed on the surface of the epitaxial film were measured. The measurement results are shown in Table 8. The results of the stress tests are shown in FIG. 19. It should be noted that the curve in FIG. 19 is an approximate curve derived from the above formula (1).

TABLE 8

| Epitaxial Film | | | | | |
|---|---|---|---|---|---|
| | Substrate | | | | |
| Film Thickness (μm) | Oxygen Concentration (×10¹⁷ atoms/cm³) | Resistivity (mΩ·cm) | Heat-Treatment Step | | Dislocation Extension No: ○ Yes: x |
| | | | Temperature (°C.) | Time (Min.) | |
| 4 | 8 | 5 | 850 | 180 | x |
| 4 | 8 | 5 | 850 | 240 | x |
| 4 | 9 | 5 | 850 | 150 | x |
| 4 | 9 | 5 | 850 | 210 | ○ |
| 4 | 10 | 5 | 850 | 90 | x |
| 4 | 10 | 5 | 850 | 120 | ○ |
| 4 | 11 | 5 | 850 | 60 | x |
| 4 | 11 | 5 | 850 | 90 | ○ |
| 4 | 12 | 5 | 850 | 30 | x |
| 4 | 12 | 5 | 850 | 60 | ○ |
| 4 | 13 | 5 | 850 | 30 | ○ |

As is clear from Tables 4-8 and FIGS. 9-19, the border between the presence and absence of the dislocation extension is at the approximate curves, and it is observable that the dislocation extension tends to occur when the heat treatment time is shorter than the time indicated by the approximate curve.

Further, from the relationship shown in Table 4 between the presence/absence of the dislocation extension and the average oxygen concentration of the epitaxial film, it is deducible that the dislocation extension can be restrained when the average oxygen concentration of the epitaxial film is $1.7 \times 10^{17}$ atoms/cm³ or more.

Experiment 10

The epitaxial silicon wafers manufactured in Experiments 5 to 9 were subjected to heat treatments simulating manufacture processes of semiconductor devices (kept at 1000 degrees C. for an hour, kept at 800 degrees C. for two hours, kept at 650 degrees C. for three hours, and kept at 900 degrees C. for an hour). The atmosphere for the heat treatments was a mixture of $N_2$ and $O_2$ (containing 3 mass % of $O_2$).

The wafers showing no dislocation extension after the stress test in the above Experiments 5 to 9 also showed no dislocation extension in a strength test after the device heat treatment in Experiment 10.

The invention claimed is:

1. A manufacturing method of an epitaxial silicon wafer comprising: a silicon wafer doped with boron and having a resistivity of 100 mΩ·cm or less; and an epitaxial film provided on a surface of the silicon wafer, the method comprising:
    growing the epitaxial film on the silicon wafer; and
    applying a heat treatment on the epitaxial silicon wafer at a temperature of less than 900 degrees C.; wherein
    an average oxygen concentration of the epitaxial film after the heat treatment is $1.7 \times 10^{17}$ atoms/cm³ (according to ASTM F-121, 1979) or more;
    wherein
    the heat treatment is performed to satisfy a formula (1)
    $$t \geq 3.71 \times 10^{56} \times X^{-7.03} \times Y^{0.27} \times Z^{3.34} - T^{16.37} \qquad (1),$$
    where:
    X (×10¹⁷ atoms/cm³) represents an oxygen concentration of the silicon wafer before growing the epitaxial film;
    Y (Ω·cm) represents a resistivity of the silicon wafer before growing the epitaxial film;
    Z (μm) represents a film thickness of the epitaxial film;
    T (degrees C.) represents a temperature of the heat treatment; and t (min) represents a time for the heat-treatment.

2. The manufacturing method of an epitaxial silicon wafer according to claim 1, wherein
    an oxygen concentration of the silicon wafer before being subjected to the heat treatment is $8 \times 10^{17}$ atoms/cm³ or more and $18 \times 10^{17}$ atoms/cm³ or less (according to ASTM F-121, 1979), and
    a film thickness of the epitaxial film is 0.5 μm or more and 8.0 μm or less.

* * * * *

UNITED STATES PATENT AND TRADEMARK OFFICE
CERTIFICATE OF CORRECTION

PATENT NO. : 9,818,609 B2  
APPLICATION NO. : 15/120630  
DATED : November 14, 2017  
INVENTOR(S) : K. Torigoe et al.

Page 1 of 1

It is certified that error appears in the above-identified patent and that said Letters Patent is hereby corrected as shown below:

In the Claims

Claim 1 (Column 14, Line 38), please change:
"$t \geq 3.71 \times 10^{56} \times X^{-7.03} \times Y^{0.27} \times Z^{3.34} - T^{-16.7}$"
To:
--$t \geq 3.71 \times 10^{56} \times X^{-7.03} \times Y^{0.27} \times Z^{3.34} \times T^{-16.7}$--.

Signed and Sealed this  
Third Day of July, 2018

Andrei Iancu  
*Director of the United States Patent and Trademark Office*